US008908407B1

(12) United States Patent
Haukness et al.

(10) Patent No.: US 8,908,407 B1
(45) Date of Patent: Dec. 9, 2014

(54) CONTENT ADDRESSABLE MEMORY ("CAM")

(75) Inventors: Brent Steven Haukness, Monte Sereno, CA (US); Mark D. Kellam, Siler City, NC (US)

(73) Assignee: Rambus Inc., Sunnyvale, CA (US)

( * ) Notice: Subject to any disclaimer, the term of this patent is extended or adjusted under 35 U.S.C. 154(b) by 125 days.

(21) Appl. No.: 13/548,382

(22) Filed: Jul. 13, 2012

Related U.S. Application Data

(60) Provisional application No. 61/513,562, filed on Jul. 30, 2011.

(51) Int. Cl.
G11C 15/00 (2006.01)
G11C 15/04 (2006.01)
G11C 15/02 (2006.01)

(52) U.S. Cl.
CPC .............. *G11C 15/046* (2013.01); *G11C 15/04* (2013.01); *G11C 15/02* (2013.01)
USPC ....... 365/49.1; 365/50; 365/49.17; 365/49.15

(58) Field of Classification Search
CPC ....... G11C 15/02; G11C 15/04; G11C 15/046
USPC .............................. 365/49.1, 49.17, 19.15, 50
See application file for complete search history.

(56) References Cited

U.S. PATENT DOCUMENTS

| 6,081,441 | A * | 6/2000 | Ikeda | 365/49.1 |
|---|---|---|---|---|
| 6,304,477 | B1 * | 10/2001 | Naji | 365/50 |
| 7,050,316 | B1 | 5/2006 | Lin et al. | 365/49 |
| 7,130,206 | B2 * | 10/2006 | Ferrant | 365/50 |
| 7,227,765 | B2 * | 6/2007 | De Sandre et al. | 365/49.15 |
| 7,319,608 | B2 * | 1/2008 | Hsu et al. | 365/163 |
| 7,423,895 | B2 * | 9/2008 | Sarin et al. | 365/49.1 |
| 7,499,303 | B2 * | 3/2009 | Lien et al. | 365/49.1 |
| 7,675,765 | B2 * | 3/2010 | Derharcobian et al. | 365/49.17 |
| 7,782,646 | B2 * | 8/2010 | Lam et al. | 365/49.17 |
| 7,791,917 | B2 * | 9/2010 | Nozieres et al. | 365/50 |
| 7,872,889 | B2 * | 1/2011 | Lam et al. | 365/49.17 |
| 7,948,782 | B2 * | 5/2011 | Chang et al. | 365/49.17 |
| 8,023,299 | B1 * | 9/2011 | Gharia | 365/49.1 |
| 8,054,662 | B2 * | 11/2011 | Chang et al. | 365/49.1 |

(Continued)

OTHER PUBLICATIONS

Rajendran, Bipin et al., "Demonstration of CAM and TCAM using Phase Change Devices", IBM T.J. Watson Research Center, IEEE, Jun. 13, 2011. 4 Pages.

(Continued)

*Primary Examiner* — Viet Q Nguyen
(74) *Attorney, Agent, or Firm* — Marc P. Schuyler

(57) ABSTRACT

A content addressable memory device based on an extremely compact design, potentially as small as $16F^2$ per memory cell. One embodiment is based on cells having two memory storage elements, such as RRAM elements. Each RRAM element and a respective FET are connected in series between a common matchline and a respective bitline. Cell content for each cell is matched against a bit of a search word by applying voltages to the respective bitlines dependent upon bit value and causing one of the two RRAM elements for each cell to discharge the matchline over a low resistance path in event of mismatch between the cell content and the bit. If no "quick" discharge occurs for multiple cells of a row, then a match is detected. In addition, a matchline recharge path to a high voltage bitline is substantially eliminated by controlling the FETs with specific wordline voltages.

40 Claims, 7 Drawing Sheets

(56) References Cited

U.S. PATENT DOCUMENTS

| | | | |
|---|---|---|---|
| 8,120,937 B2* | 2/2012 | Ji et al. | 365/49.17 |
| 8,228,702 B2* | 7/2012 | Javerliac et al. | 365/49.1 |
| 8,228,703 B2* | 7/2012 | Javerliac et al. | 365/49.17 |
| 8,320,148 B1 | 11/2012 | Derhacobian | 365/49.18 |
| 8,446,748 B2* | 5/2013 | Lam et al. | 365/49.1 |
| 8,638,582 B1* | 1/2014 | Argyres | 365/49.1 |
| 2010/0095057 A1 | 4/2010 | Li et al. | 711/104 |
| 2010/0110744 A1 | 5/2010 | El Baraji et al. | 365/50 |

OTHER PUBLICATIONS

Pagiamtzis, Kostas et al, "Content-Addressable Memory (CAM) Circuits and Architectures: A Tutorial and Survey", IEEE Journal of Solid-State Circuits, vol. 41, No. 3, Mar. 2006. 16 Pages.

Guo, Xiaochen et al., "Resistive Computation: Avoiding the Power-Wall with Low-Leakage, STT-MRAM Based Computing", Proceedings of the 37th Annual International Symposium on Computer Architecture (ISCA), Jun. 19-23, 2010, pp. 371-382. 12 pages.

* cited by examiner

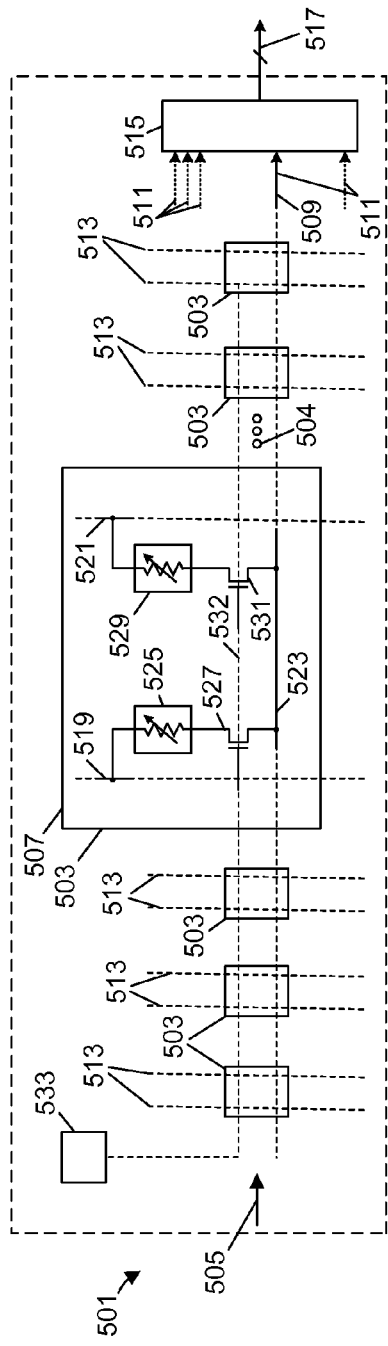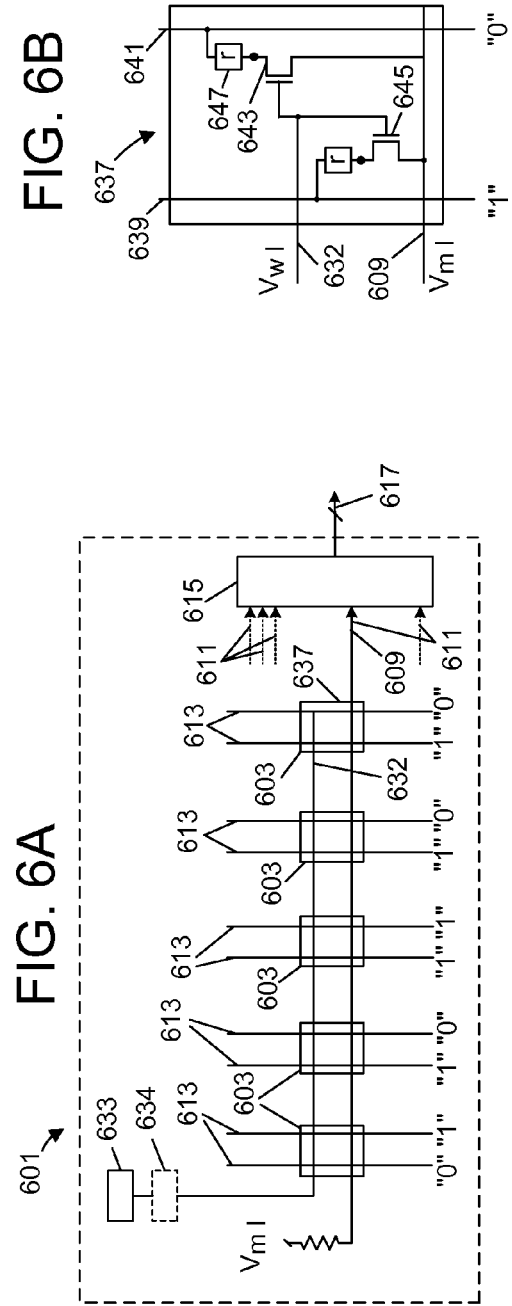

CONTENT ADDRESSABLE MEMORY ("CAM")

This application hereby claims priority to and incorporates by reference U.S. Provisional Application No. 61/513,562, filed Jul. 30, 2011 and entitled "CONTENT ADDRESSABLE MEMORY ("CAM")," on behalf of inventors Brent Steven Haukness and Mark D. Kellam.

BACKGROUND

A content addressable memory ("CAM") is a memory that receives a search word and searches the memory's storage locations to determine whether any of the locations contains data matching the search word. In many senses, this CAM lookup function is the inverse of the traditional memory read function; data in the form of the search word is received, and the memory outputs an address where the data is found (instead of the traditional read function where an address is received by the memory and the memory outputs data found at the address). CAM architecture is typically such that each memory cell incorporates comparison circuitry, such that the search word can be simultaneously compared against contents of the entire memory. This is to say, a CAM is typically used to provide a very quick lookup function against generally large sets of data, with results obtainable faster than from software-based lookup. Some CAM designs also feature a mask function, where one or more bits of the search word are masked during the search.

One type of CAM of particular interest is a Ternary CAM, or "TCAM." A TCAM typically permits stored data words to be individually masked on a sub-word basis, typically bit-by-bit. That is, in contradistinction with search word masking indicated above, a TCAM permits parts of individual stored data words to be masked during storage, e.g., on a memory row-by-row basis. This feature can be very useful in some applications; for example, for network routers, a TCAM can be used to lookup a port matching a range of IP addresses, where the range would be represented by masked data in an individual storage location, and the address of that individual storage location would be used to retrieve the port. Other applications naturally exist.

To provide this individual storage location masking capability, a TCAM has one or more memory cells that can store both a data bit value and a mask indication. The mask indication, if set, causes the cell's built-in comparison circuitry to indicate a match for the cell irrespective of the state of the corresponding search word bit. As a result, the comparison can be made to ignore a subset of one or more bits of a given stored data word during the comparison process and to return a match for the given stored data word if its constituent bits otherwise match the search word.

A typical TCAM cell 101 is indicated in FIG. 1. It should be assumed that this cell is but one cell in a wide row of cells, with a TCAM memory device having many such rows, forming an array. The heart of the TCAM cell is two separate SRAM storage cells 105 and 107 each of which is used to store opposing logic values representing a stored data bit. For example, if a binary "1" is to be stored in the TCAM cell as a data bit, SRAM storage cell 105 is caused to store a logic "1," while SRAM storage cell 107 is caused to store a logic "0." If the stored data bit is instead a binary "0," a logic "0" is stored in SRAM cell 105, while a logic "1" is stored in SRAM cell 107.

A matchline 103 common to an entire row of TCAM cells including cell 101 runs laterally through cell 101. To write data to the SRAM cells, a wordline pair WLX and WLY is asserted and data to be written is applied to differential bitlines BLX/BLX_(numeral 109) and BLY/BLY_(numeral 111). Note that WLX and WLY may be a common physical wordline. To later provide a search function for the depicted cell, the matchline 103 is raised to a precharge voltage (e.g., $V_{dd}$). A specific bit of a search word is then presented to the cell (depending on position of the cell within a memory row) via signal lines CDX/CDY (117/119) to compare cell contents to the corresponding bit of the search word; a differential voltage signal is used to represent the particular bit of the search word (generally $V_{dd}$/ground or ground/V) on these signal lines, dependent on whether the specific search word bit is a binary '1' or '0.' Should the SRAM cell contents (i.e., signals "X" and "Y") represent a mismatch with the corresponding signals (CDX/CDY), then this mismatch causes a respective pair of FETs to both conduct and thereby discharge the matchline 103. For a given row in the TCAM device, if no TCAM cell in the row discharges the matchline, then the matchline remains at its sense voltage and therefore represents a match. In the TCAM cell of FIG. 1, both SRAM storage cells 105 and 107 can also be written-to to both store a logic "0" to represent a mask indication, which produces a match result for the TCAM cell during comparison irrespective of the applied search word (i.e., by preventing any discharge of the matchline by the particular TCAM cell). The matchline 103, the various bitlines 109 and 111 and the wordlines 113 and 115 are also used to provide conventional memory device operations, including writes to the cell, data reads, and other operations as appropriate.

Present applications of both CAMs and TCAMs are limited due to large cell size and, consequently, large device size; CAMs and TCAMs also suffer from very high power consumption relative to conventional memory. For example, conventional CAM cell designs such as the one seen in FIG. 1 may have twenty or more transistors and occupy a space greater than $80F^2$ (i.e., 80 times minimum feature cell size in area). Each transistor (or other component) also generally consumes power during normal cell operations (e.g., read, write or other operations). As a result, large (capacity) CAMs and TCAMs can be expensive to operate, especially for applications where software presents a timewise-manageable alternative. That is to say, CAM and TCAM devices are typically of small capacity, are expensive, or are both small and expensive. Because typical TCAM cell designs incorporate a mask function at the subword level, TCAM devices are typically even more expensive and limited in application than typical CAM designs. Despite these limitations, CAMs and TCAMs are still frequently utilized in applications where fast lookup functions against large storage capacities are desired, especially for internet routers, video and audio applications, regression and curve analysis, and other specialized forms of computational analysis.

Were it not for the memory cell size and power consumption problems just mentioned, it is believed that CAMs and TCAMs would be much more widely used, that is, both inside and outside of those specific applications just mentioned.

A need therefore exists for a CAM architecture that is more compact and consumes less power. Ideally, the techniques associated with this architecture would be extensible to TCAM operation. It is believed that fulfillment of these needs will lead to lower cost, larger-capacity CAMs and TCAMs, and increased usage of these devices in digital designs, even beyond those fields mentioned above. The CAM embodiments disclosed herein address these needs and provide further, related advantages.

BRIEF DESCRIPTION OF THE DRAWINGS

FIG. 5 provides a functional diagram of a CAM having a single row of cells, each cell based on two RRAM elements; one of the cells (in box 507) is illustrated in enlarged detail to reveal this structure.

FIG. 6A shows a CAM similar to the one depicted in FIG. 5; FIG. 6A is used to explain how a matchline is used to signal a match between CAM row contents and a search word.

FIG. 6B shows in enlarged detail a single CAM cell from FIG. 6A.

FIG. 8 is used to further explain operation of a CAM based on resistance switching and the use of wordline regulation to inhibit a sneak leakage path.

DETAILED DESCRIPTION

I. Introduction

Figure 1:
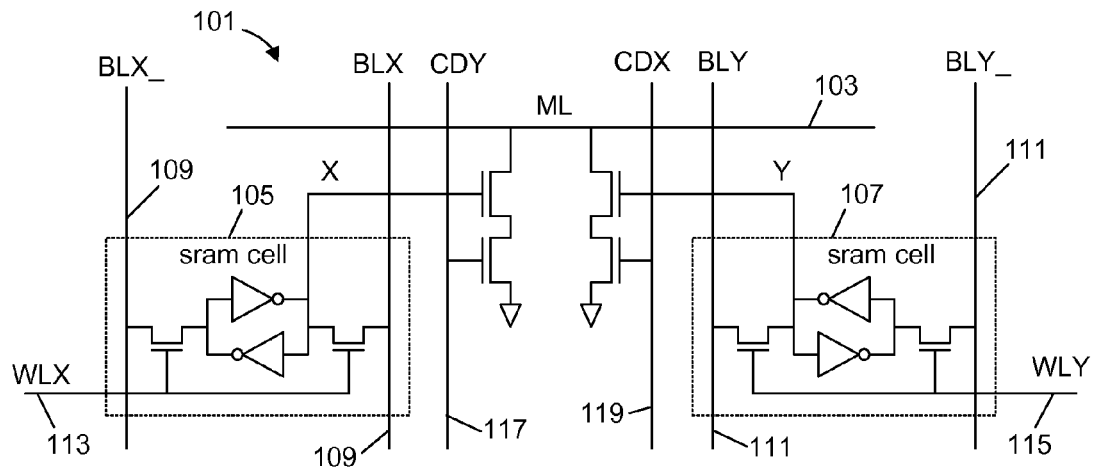
FIG. 1 provides a diagram showing a prior art TCAM cell.

This disclosure provides a content addressable memory ("CAM") cell and a CAM-cell based memory device having a significantly smaller footprint and power consumption than some conventional CAM designs. The CAM cell is based on a bistable element and at least one switch. In some embodiments, the CAM cell is based on two bistable elements, each one having an associated switch. In more specific embodiments, each bistable element is a resistance-switching memory element, such as a RRAM element, and each switch is an FET (i.e., a field effect transistor). Small ternary CAM ("TCAM") functionality is optionally achieved using two bitlines per cell, one matchline per row, and a bistable element and a switch in series between the matchline and each bitline for the cell (see, e.g., FIGS. 3A and 3B). This architecture provides for a super-small cell design, which significantly reduces cell size and power consumption and can be expected to significantly reduce TCAM cost.

Note that the term "bistable" as used in this disclosure indicates that a structure has two relatively stable states, i.e., that can be used to store information and then, a time later, be sensed to recover the stored information. As this definition implies, these states can be stable for long duration, such that refresh operations are not necessary, or for only a short duration, for example, when implemented as a form of dynamic random access memory, with refresh operations being used to extend state retention.

An integrated circuit ("IC") can be founded on this architecture, thus providing a memory device with extremely high density (and thus potentially very large storage capacity). One embodiment provides an array of such CAM cells, organized as rows and columns. Data words are stored in individual rows of the memory array. The search function is provided through a command architecture adapted to receive a search command together with a search word. The search command causes the entire memory device to be searched substantially simultaneously, with the search word being simultaneously compared against the data content of many rows in the memory array. Responsive to the search command, the memory device outputs a memory address of data which matches the search word, if there is any such data. Because the comparison is performed against all rows, typically within a single or small number of reference clock cycles, the device provides a very fast lookup capability against a large number of storage locations. This is useful in Internet routing and other applications where very fast lookup is desired. Each row of such a device (i.e., of the CAM or TCAM array) has its own individual wordline. Each row is enabled by the corresponding wordline so that each row can be individually written to or read, or so that multiple rows can be searched or erased as a block or group.

This basic architecture can be configured to provide TCAM functionality, such that every cell in the array stores a bit of data or a mask indication.

Several optional techniques are employed to further facilitate super-small cell and device architecture.

First, one optional technique relies on the use of two RRAM elements in each cell. An RRAM element is a resistance switching memory element that has a high resistance state and one or more distinct low resistance states, and that can be controllably switched between these stable states. A normally-high-resistance dielectric can be made to partially conduct through the formation of a conductive path. The conductive path is created as a result of the application of a sufficiently high voltage (i.e., an electric field). Depending on the type of RRAM element, the conductive path formation can arise from different mechanisms. These mechanisms include defect modification, metal migration, ion migration, atomic vacancies, etc. Forming the path is generally referred to as "setting" the RRAM element. Breaking the path, usually by applying an appropriately high voltage of an opposite polarity, results in the RRAM element resuming a high resistance, consistent with the native properties of the particular dielectric material. This process of breaking the conductive path is generally referred to as "resetting" the RRAM element. The RRAM element can be repeatably "set" and "reset" many times by appropriately applied voltages. Because an RRAM element typically has small size and only two terminals, used both to switch states as well as to non-destructively read the cell state, an RRAM element typically provides extremely small footprint, as small as several $F^2$. Note that as used herein, causing a memory cell to store a specific bit of digital information—a binary "1" or "0"—is generally referred to as "writing" to the memory cell; whereas causing a specific RRAM element to adopt either a high or low resistance state will generally be referred to as "resetting" or "setting" the RRAM element, respectively.

A second optional technique features the use of two RRAM elements and associated switches (e.g., FETs) per cell, with each RRAM element and an associated switch extending in series between a matchline and a respective bitline. A data bit can be stored in the cell using opposite RRAM element resistance states. For example, for a cell based on two RRAM elements, a specific one of these RRAM elements is set to a low resistance state and the other is reset to a high resistance state, to store a data bit of "1;" to store the opposite value "0," these respective states are inverted. TCAM functionality is optionally provided by permitting storage of two high resistance states. To perform search in this context, a corresponding bit of a search word is presented on two bitlines traversing the cell as a differential voltage, for example, $V_{dd}$ and ground. Memory cell contents are then compared against the search word bit dependent the combination of the respective bitline voltages and the resistance states of corresponding RRAM elements. To perform this comparison, the matchline that runs through the cell is precharged to a voltage, and a wordline for the cell is also raised to turn on the respective switches (e.g., FET's) to enable the comparison process. It is then determined whether any memory cell in a row discharges the matchline because that cell mismatches the information presented on the corresponding bitlines. This determination is based on whether any RRAM element in a row "quickly" discharges the matchline to a bitline at low voltage (e.g., ground) through a low resistance state. That is, the low resistance state is low enough, relative to all high resistance states in parallel for a row, that a low resistance state RRAM element coupling the matchline to a low voltage bitline (i.e., a match) can be identified and discriminated based on difference in RC discharge characteristics from a condition where only high resistance RRAM elements couple the matchline to one or more low voltage bitlines. It is observed that resetting both RRAM elements of a memory cell to a high resistance state permits storage of a mask bit in that cell, since the RRAM elements in the memory cell then provide no low-resistance path through which the matchline can discharge quickly. If no cell in a row quickly discharges a matchline during search, meaning that every cell in the row has content which matches a corresponding bit of a search word or is masked, then the matchline remains at high voltage, at least for a period of time (i.e., it only slowly discharges). A "match" is then detected between stored data for the particular memory row and the search word.

A third optional technique further regulates control over the FETs (or other suitable switches) to cut off a recharge path that can impede rapid matchline discharge in the event of a mismatch. That is, it is desired to avoid a condition in which a low-resistance path between a high voltage bitline (e.g., $V_{dd}$) and the matchline turns on to provide additional current supply to the matchline once the matchline voltage falls to a voltage $V_{th}$ below the wordline voltage, where $V_{th}$ is the threshold voltage of the FET. If one cell's RRAM element grounds the matchline through a low resistance (e.g., representing mismatch) while another cell's RRAM couples the matchline to high voltage through a low resistance, this condition if left unchecked can impede matchline discharge rate differentiation. This is because, depending on design, the "quick" discharge path provided by the low resistance connection to ground can be overwhelmed by an equally-low resistance connection of the matchline to high voltage. To counter this possibility, the third optional technique inhibits this recharge path from forming by using a regulated wordline voltage that keeps those FETs which couple to a high-voltage bitline to the matchline in an off state. This technique thus helps preserve clean distinction between RC discharge times for row match versus mismatch conditions.

The CAM cell introduced above can be implemented as part of a CAM device (such as a memory IC), using a design based in two bistable elements, and making elective use of the optional techniques just introduced. The presented designs permit fabrication of a CAM device with a minimum cell size of less than about $16F^2$, that is, about one-fifth the $80F^2$ cell size mentioned earlier. In addition to providing fewer components to burn power during normal memory device operations (such as via writing and reading memory contents), it is believed that the cell designs and techniques presented in this disclosure facilitate denser, more economical CAM designs, thus increasing the possible usage of CAMs in general, both within and outside of the fields mentioned earlier.

A. Device Architecture.

Figure 2:
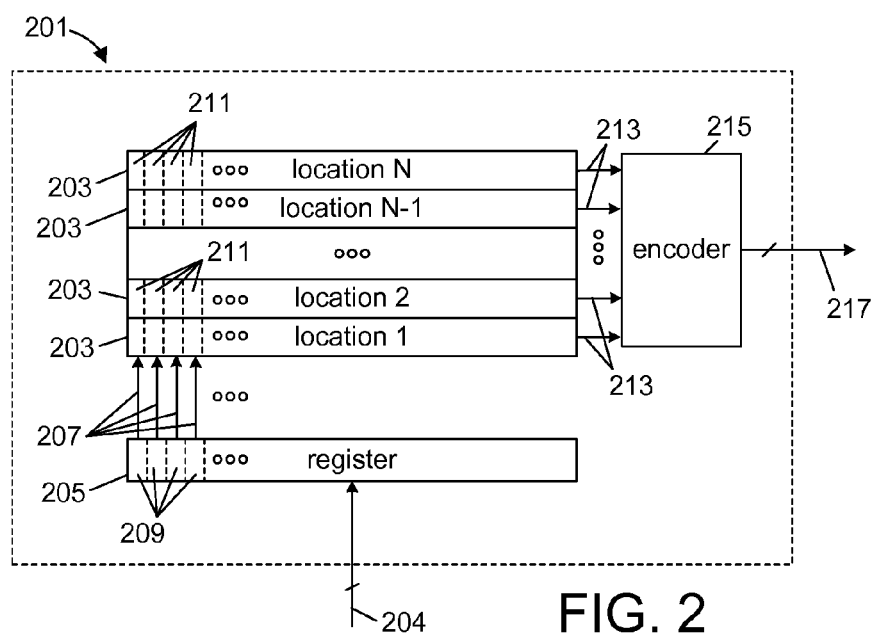
FIG. 2 provides a block diagram showing a CAM or TCAM device according to one embodiment.

FIG. 2 shows a CAM device 201 comprising a memory array. The memory array is arranged as a matrix of memory cells 211, organized into rows and columns. Each row provides a storage location 203 for a data word, with the CAM device having an aggregate of "N" rows or equivalently N storage locations. Each of "j" columns represents a particular bit position for each row. Like conventional memory devices, the CAM device 201 possesses input/output ("IO") circuitry, not shown in FIG. 2, to receive commands from a master along a command bus and to receive and provide data via a data bus 204. A write command causes the CAM device to store data provided via the data bus 204 at a row address specified by the command, and a "read command" causes the CAM device to provide data found at the row address specified by the command to the master, again, via the data bus 204. Being as it is a CAM device, memory device command logic can also process a search command. A search command causes the memory device to at-once compare all of its storage locations to a specific search word provided to the memory device via the data bus. The bitlines for the CAM device are set to respective states matching the specific search word, and the matchline associated with each individual row is discharged "quickly" dependent on whether or not the row stores data matching the search word. The term "at-once" is used to mean that the comparison occurs substantially simultaneously for an array, e.g., for all rows at the same time, or sequentially, for blocks of rows in close succession, e.g., with blocks of storage locations being sequentially compared to the search word in close succession. A result returned by this command is the row address of a storage location having the data that matches the search word, or an indication that no memory address has data matching the search word.

To provide a typical implementation example, a CAM device can have capacity of one million rows, each row 160 bits long. Other designs are of course possible. The CAM has a register 205; responsive to a search command, the CAM device stores a provided search word into this register. The register is in turn coupled to the bitlines 207 of the array, and the search command causes bitline driver logic to impose on the bitlines states representing individual bits 209 of the search word. Wordline driver logic in turn activates the wordlines of the array to enable the comparison. The bitlines 207 cross respective memory cells 211 in each of the N rows, with a comparison between the search word and each of the N rows occurring substantially simultaneously for the entire device. Once again, other designs are also possible. The register 205 and bitlines 207 are also used for (i) writing data into the CAM device (e.g., set or reset of the individual RRAM elements of each memory cell in an addressed row to write a data bit or mask indication), (ii) erasing data in the CAM device (e.g., block-based or row-based functions that set RRAM elements to default values for each cell), (iii) retrieval of data from an addressed row, and (iv) the search function, as just mentioned.

To enable the search function, each memory cell 211 includes circuitry that supports built-in comparison. As part of this circuitry, each of the N rows of the array also has a per-row matchline 213 that will provide a voltage output representing, at an appropriate sampling point, relative to an appropriate threshold, whether a match exists or not between a given search word and associated CAM row. The matchlines for all N rows couple to an encoder 215, which determines the address of any matchline showing correspondence of the data stored in the row with the search word. The encoder typically provides a multi-bit output 217 indicating a single row address if one or more matches are found or that none of the N rows provides a match. An illegal address value can be returned in the event of no match. Alternatively, a match/no match state can be indicated by a separate signal or a register flag. In a typical embodiment, the address is output according a priority that reconciles multiple matches, if they exist. For example, the priority can be configured to pick the lowest memory address with data matching the search word, or to output an address according to another desired scheme. Designs that output multiple addresses in the event of multiple matches are also possible.

As will be further described below, optional embodiments of the CAM device 201 support ternary CAM (TCAM) functionality, where one or more bits of a storage word are selectively masked by the device. This mask function is obtained by causing the cell to store a "do not care" state that will produce a match result for that cell irrespective of the search word. This functionality should not be confused with a mask function which can be applied on a global basis to the search word, e.g., where the memory array is controlled to not compare certain rows or columns in the array with the search word. Some embodiments of CAM device 201 provide this latter functionality; some embodiments also provide a feature where individual rows, or blocks of rows, can be made the focus of search comparison or can be made exempt from comparison. Also, in some embodiments, this TCAM functionality is supported throughout a row on a bit-by-bit basis, with every memory cell in the CAM being based on a two-RRAM design.

B. Basic Cell Architecture.

Figure 3A:
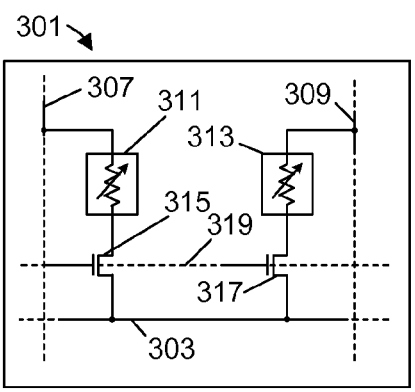
FIG. 3A provides a schematic showing a cell that can be used in the embodiment of FIG. 2.

FIG. 3A shows a single CAM cell 301 according to one embodiment. Each cell of the array of FIG. 2 can be a repeated instance of this cell design, or alternatively, only a subset of cells (e.g., specific columns) can be based on this design. A matchline 303 runs laterally through the cell. In addition, a pair of bitlines 307 and 309 runs through the cell so as to cross the matchline. The bitlines 307 and 309 serve as column access lines for a single column of a memory array, and so define a particular bit storage position for each row of the array (e.g., least significant bit). The bitlines are also used during search, read, write and other memory functions as appropriate, to aid in the performance of these functions.

Two RRAM elements 311 and 313 and two FETs 315 and 317 are further depicted in the cell. A first one of the RRAM elements 311 and a first one of the FETs 315 are connected in series to couple the matchline 303 to a first one of the bitlines 307, while a second one of the RRAM elements 313 and a second one of the FETs 317 are connected in series to couple the matchline to a second one of the bitlines 309. Each of these "legs," consisting of one RRAM element and one FET, is said to constitute a "1T1R" structure. That is to say, only two elements per leg are used for data storage and comparison operations, representing a 6-8$F^2$ size for the particular leg (and an approximately 12-16$F^2$ implementation for the cell overall). In this design, the two FETs are controlled together via a common wordline 319, which further reduces cell complexity and cell design. As with the matchline 303, this common wordline 319 is also shared by all CAM cells in a given row. As was mentioned earlier, the wordline voltage can be defined in some embodiments both to enable search functionality as well as to inhibit a recharge current path from forming between a high-voltage bitline and the matchline, i.e., by controlling a first FET (315 or 317) to permit discharge of the matchline to a low voltage bitline, and by controlling a second FET (317 or 315) to inhibit recharge of the matchline from a high voltage bitline. The wordline voltage can be defined so as to turn on the FET connected to the low-voltage bitline but maintain the second FET in an off state as the matchline discharges. In this manner, a low resistance discharge path for any cell coupled to the matchline is more readily discriminated from a state where there is no low resistance discharge path for the matchline, based on respective RC discharge characteristics. This will be further described below in connection with FIG. 6D and other FIGS. As will be discussed below in connection with FIGS. 3B, 4 and 7, the matchline and wordline also serve roles during write, erase and read operations for each memory device by enabling current flow appropriate to resetting/setting the various RRAM elements in a controlled manner, and by enabling current flow that permits non-disruptive sensing of the resistive state of each RRAM element.

To further use the cell of FIG. 3A as a TCAM cell, all that is necessary is for device architecture and command logic to permit storage of like-resistance states in both of the 1T1R legs of the cell. Note that in the depicted architecture (i.e., where a row of cells operates as a wired-NOR circuit that discharges a matchline in the event of mismatch), the storage of two high resistance states is used to signify a mask state by preventing any "quick" discharge of the matchline by the particular cell. In other architectures (e.g., not using this wired-NOR architecture), it would be possible to use logic which uses a low resistance state to represent a match (e.g., two low resistance states could then be used to represent a masked bit).

Figure 3B:
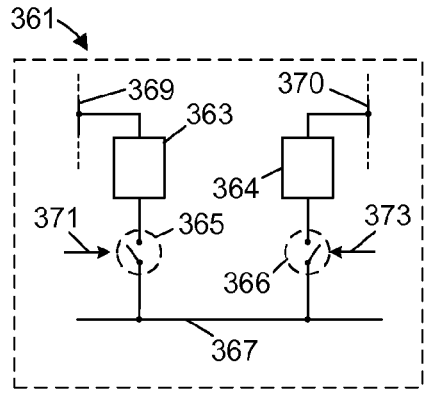
FIG. 3B provides a functional diagram of another CAM cell that can be used in the device of FIG. 2. The cell of FIG. 3B is based, in particular, on two bistable elements, each connected in series with a respective switch.

It was earlier mentioned that various aspects of this cell design are optional. FIG. 3B shows a more general embodiment, based on two 1T1R "legs," each using potentially other forms of bistable memory elements and other forms of switches. For example instead of using RRAM elements, other types of nonvolatile or volatile memory elements can be used. Although known by a variety of names, many forms of "bistable" elements have properties where resistance change is a manifestation of change in physical materials. For example, RRAM, magnetic random access memory (MRAM), phase change random access memory (PCRAM), nanowire RAM, and similar designs all operate based on similar state change principles where the current flow through the material (or equivalently, voltage drop seen across the material) changes depending on material state. Also, there are many different types of devices that are known as "RRAM." The term "RRAM" as used herein includes any memory with memory elements that include resistance-switching material that can be cycled between high- and low-resistance states. For example, RRAM elements can include resistance-switching materials such as phase-change materials, insulating materials, solid electrolyte materials, and organic materials. Some examples of resistance-switching insulating materials include $TiO_2$, NiO, $SrZrO_3$, $SrTiO_3$, $ZrO_2$, MO, MgO, $WO_3$, and $HfO_2$. Examples of resistance-switching electrolyte materials include $GexSe_{1-x}$, $GeS_2$, $Cu_2S$, $Ag_2S$, and $SiO_2$. Of course, other materials can also be used. Some types of RRAM may also be referred to as "CBRAM" (Conductive Bridging RAM) or ReRAM.

The cell design depicted in FIG. 3B can be based on any form of state switching "bistable" element; for example, any of the bistable elements mentioned just above, such as based in PCRAM or MRAM, may also be employed. Like the embodiment of FIG. 3A, the CAM cell of FIG. 3B includes two bistable elements 363 and 364, each providing an independent conductive path between a matchline 367 and a respective bitline 369 or 370. Each bistable element is accompanied by an associated switch 365 or 366, each switch optionally receiving a control input 371 or 373 to govern operation of the switch. A number of structures can be employed as these switches, for example, current steering elements such as diodes, other forms of transistors and other circuits with logic or other control inputs; one possibility in lieu of the FETs of FIG. 3A is to use a relatively more complex logic circuit that simply switches off the current flow path off when the associated bitline is at a higher voltage than the matchline. Because each bistable element 363 and 364 effectively stores one binary state, the CAM cell 361 in aggregate is able to store three or more different states, such as two possible logic values of a data bit or a mask indication. CAM cell 361 is thus suitable for use supporting TCAM operation.

As observed with reference to FIG. 3B, each bistable element 363 and 364 is arranged in series with an associated switch 365 or 366 between the matchline 367 and the respective bitline 369 or 370. The matchline and bitlines are controlled concurrently to perform setting and resetting of the bistable elements as appropriate, e.g., by causing relatively large current flow that will trigger a state change in an associated RRAM or other bistable element. To perform this task, write data received for storage in a given memory location is received and stored (e.g., via data bus 204 and register 205 from FIG. 2) and is converted to bit line signals, and the wordline and the matchline for the memory location are set to appropriate voltages to write the data into the memory location, e.g., via applying appropriate polarity voltages. The matchline and bitline are also selectively controlled to perform non-destructive reading of cell content by applying and sensing a small voltage or current dependent on the states of the bistable elements. Here, the bitlines are precharged to a desired sense value (e.g., ground, identified as GND in the FIGS.) and then isolated, and the matchline is driven to a read voltage; note that these voltages can be inverted, and other biasing schemes can also be used. Following precharge and isolation, the control inputs (e.g., a shared wordline) are then raised to enable current flow through the memory cell. The bitlines coupled to the matchline through a first bistable element state are charged differently than bitlines coupled to the matchline through a second bistable element state. The bitlines are then sensed, amplified, inverted as necessary, and the resulting state is stored in an output register (e.g., register 205 from FIG. 2) for output via a data bus (e.g., bus 204 from FIG. 2). The ability of current to flow is regulated by the control inputs 371 and 373. As indicated, the control inputs can be shared, not only across a cell, but as a wordline common to each row. In addition, each control input if desired can be designed to turn the associated bistable element on only when the associated bitline has a low voltage (e.g., ground or another low reference) relative to the matchline, i.e., the current path can be turned on dependent on state of the associated bitline.

The CAM cell 361 can be employed as part of a row, where it is to be detected whether all data in the row match a search word. The matchline is charged to a first voltage and each bitline is charged to a second voltage, such as $V_{dd}$. To enable the comparison, the control inputs 371 and 373 (e.g., a shared wordline) are then used to turn the switches on. Then, search operations are initiated by driving appropriate bitlines to ground, potentially allowing one of the bistable elements to discharge the matchline dependent on the state of the bistable element and dependent on the voltage difference between the matchline and the bitline for the particular cell. If the bistable element is an RRAM element and has a low resistance state, for example, the matchline discharges quickly dependent on the voltage of the bitline 369 or 370. Using this process, consecutive searches can be performed simply by toggling bitlines with wordline voltages remaining static.

The switches 365 and 366 can take a number of forms. For example, as introduced above, the switch can be an FET that is driven using a defined wordline voltage, so as to cut off a recharge current flow between the matchline 367 and the respective bitline 369 or 370. That is, current flow can be inhibited for FETs where the matchline has a lower voltage than the bitline by appropriate selection of wordline voltage.

The cell designs of FIGS. 3A and 3B present an advantage in that they require only a single sensing operation to discriminate match and mismatch states for a given row. That is, notwithstanding a minimal circuit structure (e.g., two RRAM elements and two FETs per memory cell), a single operation can be performed for an entire row of memory cells to discriminate a match versus mismatch condition for the row (e.g., by raising the matchline voltage and testing the RC characteristics of the discharge). It is not necessary to discriminate whether the RRAM elements which couple the matchline to a high voltage bitline have high or low resistance states, but rather only whether one or more low resistance states for a row provide a discharge path for a charged matchline. Additional detail regarding comparison techniques are presented below, especially in connection with FIG. 6.

Figure 10:
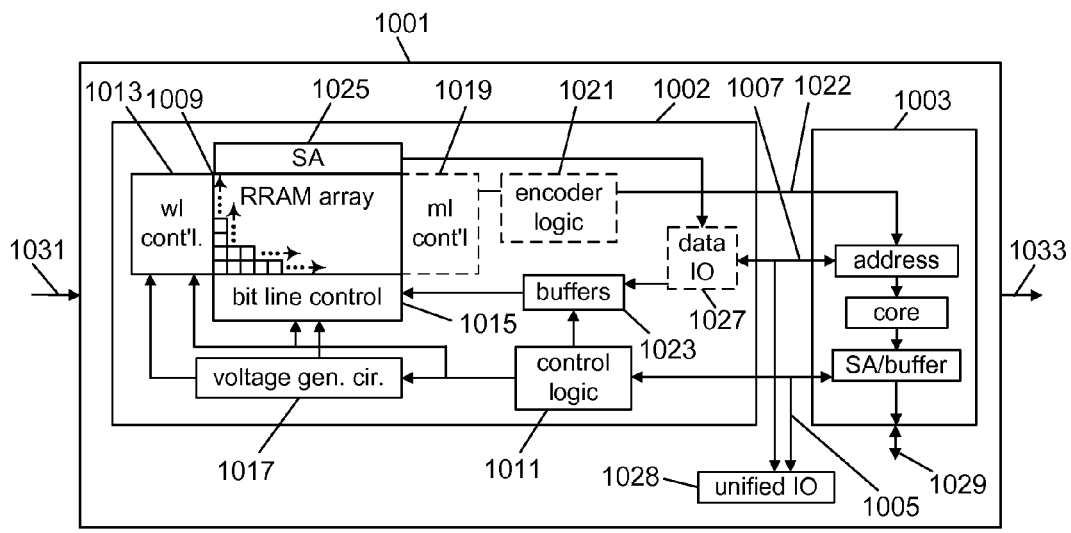
FIG. 10 is a block diagram of a system that implements both (a) a CAM for address lookup and (b) a random access memory (RAM) for output of programmed data in response to an address yielded by the CAM.
Figure 11:
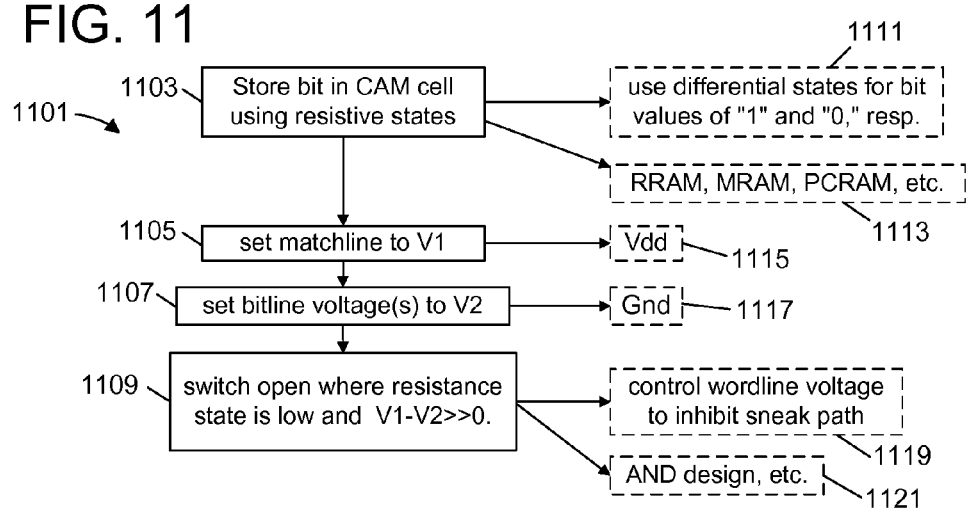
FIG. 11 is a method block diagram.

With basic cell design principles thus introduced, the architecture of a CAM device (e.g., a CAM IC) will now be further described with reference to FIGS. 4-7. This discussion will assume a CAM cell design such as seen in FIG. 3A but, by extension, the architecture can also be based on the cell design of FIG. 3B. Much of the discussion below will for simplification focus on operation of a single bank of memory cells in such an IC device, but it should be appreciated that the devices provided below may be arranged in single or multiple banks. Following the architecture discussion, use of wordline voltage control to inhibit a recharge path will be discussed, with reference to FIGS. 8-9. The discussion will then shift to an illustrative application of a CAM or TCAM in connection with a conventional memory structure, for example, with a RAM device that provides a programmable data output, especially useful to network routers (FIG. 10). Finally, this disclosure will conclude with a summary of basic methodology (FIG. 11).

II. Device Architecture

Figure 4:
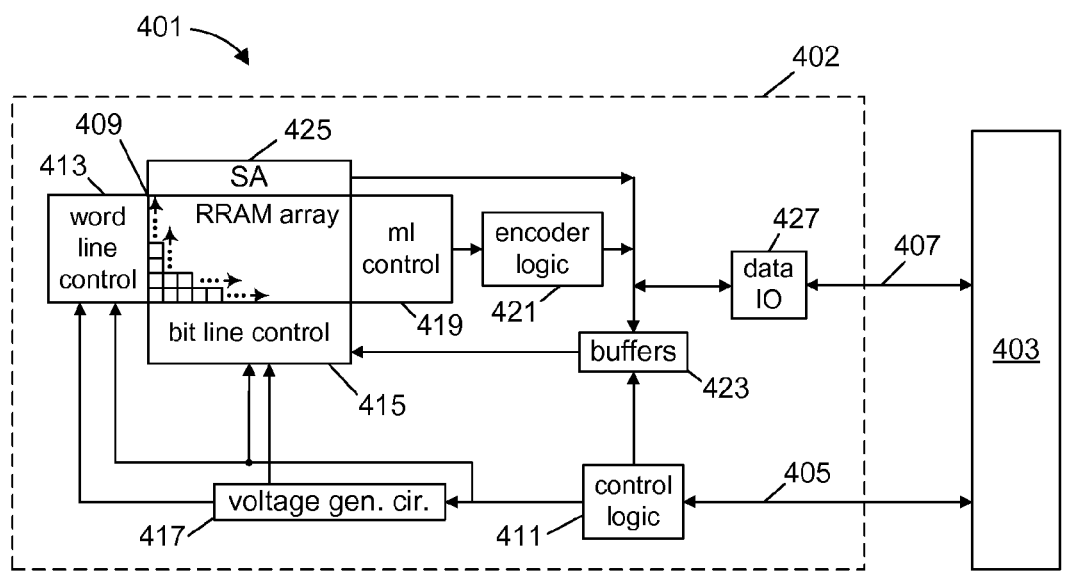
FIG. 4 shows one embodiment of a system rooted in a CAM. The system includes other circuits such as a memory controller (seen at the right side of the FIG.).

FIG. 4 shows a memory system 401, including a CAM integrated circuit device ("IC") 402 and a memory controller 403. Memory controller 403 commands write, erase and read operations for CAM IC 402, as well the search function just described. If desired, the memory controller can be embodied in a general purpose CPU, a DSP chip, as a memory board-specific microprocessor, all examples of integrated circuit devices ("ICs"). Communications between ICs are effectuated using circuit board traces 405 and 407, which respectively denote a command and address link ("CA" or "CA bus") and a data link ("DQ" or "data bus"). Each of these links can consist of a number of individual signaling paths, with each word or packet transmission over the link encoded in either a multipath (serial or parallel) or single path, serial manner. Each CA and DQ path may further be either single-ended or differential, point-to-point or multidrop, or configured in any other suitable manner. The various links are used in part to control management of data within RRAM memory array 409 and exchange of that data with the memory controller IC.

As shown in detail within the CAM IC 402, CA transmissions are received by control logic 411. The control logic is responsible for sequencing the device operations that respond to commands and direct data to and from specific memory addresses. As alluded to previously, commands are used to trigger a number of different operations. Write operations typically involve setting or resetting individual RRAM elements based on data received via the DQ path 407. Erase operations relate to row-, block- or device-based set and reset of RRAM elements according to a default pattern, without provided data. Data read operations involve the provision of data from an address-specified row via the DQ path 407 to the memory controller.

Other types of commanded operations can include power mode operations, calibration operations, refresh operations or potentially other operations. When a particular command involves access to the RRAM array 409, the control logic 411 accesses word line control logic and bitline control logic, 413 and 415, respectively, to control the array as will be explained below. In concert with these activities, the control logic 411 also triggers generation of appropriate voltages from voltage generation circuitry 417, with these voltages being provided to the wordline control logic and bit line control logic, 413 and 415 to assist with operations involving the array. In this context, the voltage generation circuitry 417 provides the supply of all necessary voltages and connections, such $V_{dd}$, a connection to ground, $V_{wl}$, $V_{set}$, $V_{reset}$, and other voltages and references as described below. Depending on the particular command, access to the RRAM array 409 also involves the use of matchline control circuit 419 and encoder logic 421 and/or buffers 423. The matchline control circuit includes driving and detection circuitry for read and write operations, as well as for matchline precharge during search and compare operations.

To provide an example, if the controller commands a search in conjunction with a search word transmitted via the data bus, the search word is stored in buffers 423 and is used by bitline logic 415 in controlling the various bitlines of the array. The control logic enables all matchlines through the matchline control circuit 419. In concert with these actions, all wordlines for the rows being searched are raised to an appropriate enabling voltage. Matchline output is then provided to encoder logic 421 which, in response, outputs a null match indication or a row address indication through data IO 427.

If the command involves the writing of data into a row, data received via DQ link 407 and data IO 427 is first stored in one of buffers 423. The wordline control logic 413 and bitline control logic 415 then direct the wordlines and bitlines to effectuate this writing of data. For example, this direction typically includes using a decoder to identify and enable a specific wordline (such that the associated row can be written-to) and then driving individual bitlines to appropriate values to create voltage levels and polarities needed to set or reset individual RRAM elements associated with the wordline. The matchline voltage for the selected row is driven to an appropriate voltage intermediate to voltages used for the various bitlines. For solid electrolyte RRAM, individual RRAM elements are individually "set" by applying a "set" voltage between the bitline and the matchline. The set voltage is of magnitude sufficient to form conductive filaments through the element's electrolyte, to build conductive filaments or otherwise establish a low resistance path. The conductive filaments are later selectively broken by applying a reset voltage between the bitline and the matchline. The reset voltage is opposite in polarity to the set voltage and is of sufficient magnitude to return the RRAM element to its high resistance state (thereby "resetting" the specific RRAM element as appropriate). Other types of RRAM can be set and reset by different techniques, for example, using same polarity voltages or other techniques appropriate to the specific device technology. These operations are accomplished for cells in a given row by turning on the FETs for each cell's bistable elements, by raising the matchline to $V_{reset}$, and by simultaneously driving the respective bitlines to a low voltage (e.g., ground) or a high voltage (e.g., $V_{set}+V_{reset}$) in order to effectuate the appropriate polarities. As noted, each wordline can have its voltage controlled so as to inhibit low resistance recharge paths between high voltage bitlines and the matchline. A form of this voltage control can also be used during write operations to regulate a voltage difference applied across RRAM elements, and thus help avoid over-programming. Note that this architecture provides a mechanism for storing a bit of data in the form of a differential resistance state in each particular memory cell, as has been described earlier.

In some embodiments, individual cell tolerances may be such that multiple "set" or "reset" attempts are necessary, depending on specific RRAM technology used; thus, multiple state change pulses are used in some embodiments in order to effectuate proper write operations.

It should also be noted that, in the description above, a voltage difference across an RRAM element is used for both writing and reading data. Notably, with RRAM elements, it is typically desired to read cell state using a smaller voltage than that used for writing, e.g., to avoid read disturb when servicing either read or search commands. This goal can be achieved in a number of ways, for example, driving write operations using relatively strong currents but performing data reads using much smaller current flows.

An optional erase operation for a row of cells may be included that is similar to a write operation just described, except that data is typically not provided to the CAM from an external source; rather, the CAM is controlled simply to write all memory cells (for a row or block) to a predetermined value (e.g., a logic "1" or "0"). To implement this function in a 2-RRAM element design, alternating bitlines are coupled to $V_{set}+V_{reset}$ or ground, respectively, with the matchline being set to $V_{reset}$ in the manner described earlier.

In response to a read command directed to a particular row, the wordline control logic 413 decodes row address and enables the appropriate wordline. The appropriate matchline is also precharged and all of the bitlines or bitline segments which cross the selected row are also precharged to a reference voltage (e.g., ground or $V_{reset}$, or $\frac{1}{2}V_{dd}$). The matchline will serve as a common source line for the particular row during the read operation, while the bitlines are used for sensing. Assertion of the wordline for the selected row enables current to flow, with any consequent change in cell current on the various bitlines being sensed by sense amplifiers 425 at an appropriate sampling time. That is, following precharge and wordline assertion, each bitline will experience current flow in a manner dependent on state of the associated RRAM element. As should be apparent, voltage mode or current mode techniques may be used for this sensing, depending on design. Again, to avoid unintentional writing of data, a smaller read voltage $V_{ml} < V_{reset}$ can be advantageously used, depending upon design (e.g., where the bitlines are at ground). In many embodiments, the matchline voltage can be approximately $V_{dd}$ ($V_{ml} \approx V_{dd}$). Data obtained from the sense amplifiers are suitably amplified and then provided to data I/O interface circuit 427 for output to the controller or another recipient device.

The CAM device is controlled to perform any other necessary or appropriate operations, including the operations expected of more traditional memory devices. For example, in some embodiments, it may be necessary to refresh memory row contents in order to retain data more than a threshold time. Refresh operations are well understood and will not be described here, other than to note that such operations typically involve reading a row of data and rewriting that data back into the particular row of memory. Other operations without limitation can involve various calibration operations, wear leveling, atomic operations, or nearly any other type operation suitable for a memory device.

The control logic 411 regulates timing of all of these various tasks.

FIG. 5 shows a more detailed elaboration of a CAM IC 501, focusing on a single row 505 of cells; while six cells 503 are specifically illustrated, ellipses 504 denote the fact that a typical row is much wider than just six cells, e.g., 160 cells wide. Also, while only one row 505 is illustrated in FIG. 4, it should be appreciated that a high capacity CAM will typically have many hundreds of thousands or millions of such rows. The number j of bits or cells 503 per row and the number N of rows for a device is typically defined according to specification. All CAM cells in illustrated row 505 share a common matchline 511; for the discussion which follows, using the example of the illustrated row 505 and its matchline 509, it should be understood that this discussion also applies to all of the rows of the CAM IC.

Each cell in a row is crossed by two unique bitlines 513, i.e., with these bitlines being shared by other cells in "the same" logical column within other rows. That is to say, if a row includes 160 storage cells, then 320 bitlines cross that row, two bitlines per cell. Also, by way of example, for the illustrated design, if the CAM includes one million storage locations, then each bitline crosses up to one million matchlines. In practice the number of rows crossed by each physical bitline will be limited by performance requirements and, to this end, some embodiments feature multiple physical bitline segments that are separately driven in close succession, e.g., for better speed. As was introduced earlier, the various matchlines 511 are all provided to an encoder 515, which provides an output 517 indicating addresses (if any) where row content collectively matches the search word.

To better explain the functionality of the device of FIG. 5, a particular one of the memory cells 503, seen in the middle of FIG. 5, has been enlarged and will be referred to as memory cell 507; each CAM cell 503 is assumed to be identical to this enlarged cell 507, though this is not required for the design of the CAM IC 501. The enlarged cell includes first and second bitlines 519 and 521, and a matchline 523 that is shared by these bitlines. Matchline 523 is part of matchline 509 shared by the bitlines 513 of all the memory cells in row 505, as just mentioned. As was the case for the previous cell example from FIG. 3A, the cell 507 provides two current flow paths, one for each of bitline 519 or 521 from the shared matchline 523. Along a first current flow path, bitline 519 is coupled to matchline 523 via a first RRAM element 525 in series with an associated FET 527, and along a second current flow path, bitline 521 is coupled to the matchline 523 via a second RRAM element 529 in series with an associated FET 531. Each FET receives a control input, which in this example is shared, that is, the control input is provided by a common wordline 532. As mentioned, the wordline is also shared by every memory cell in the row, as a common control input.

One desirable characteristic for RRAM elements 525 and 529 is that there not only be a difference in resistance between high and low resistance states, but that the difference be large enough in magnitude that state changes can be easily discriminated. To this end, the use of a very high ratio of relative state resistances ($R_{high}/R_{low} \gg 1$) is particularly advantageous. The ability to discriminate these resistance states is especially important in CAM design, because the bits stored in any number of the memory cells in a given row may fail to match the corresponding bits of the search word. If the ratio between the resistance states of the RRAM elements is insufficiently large, it may be difficult to discriminate a state where one or more cells discharge the matchline via a low resistance path to ground (i.e., a "mismatch") from a state where numerous high resistance paths in parallel couple the matchline to ground (i.e., each representing a "match"). For a CAM architecture based on j-bit-wide storage words, the high resistance state should provide at least $(j-1) \cdot (V_{dd} - V_{ml-min})/V_{ml-min}$ times the resistance of the low resistance state and, ideally, the RRAM architecture provides a much greater resistance ratio in order to facilitate match detection. Here, j represents the width of the row in terms of cells, and $V_{ml-min}$ represents the minimum voltage to which the matchline is allowed to discharge during comparison against the states of the bitlines, i.e., where only a single memory cell "quickly" discharges the matchline to a low voltage bitline. $V_{ml-min}$ is defined taking into consideration the need to a corresponding wordline voltage for the FETs that inhibits recharge of the matchline from the bitlines in the high voltage state in other cells. Based on these metrics, the ratio between these resistance states can be relatively small (e.g., 50), but ideally is 100 or even greater.

Prior to proceeding with additional details regarding operation of the circuit of FIG. 5, it is first helpful to again point out that a bit is stored in the memory cells 503, including the memory cell 507, using a differential state, that is, as a combination of a high resistance state and a low resistance state, or a low resistance state and a high resistance state of the RRAM elements 525 and 529, respectively. During search, bitlines for the particular column of the memory array, that is, for a particular bit of the search word, are set to voltages representing a differential state corresponding to the binary value of the search bit for the particular column. Thus, if a logic "0" were stored in memory cell 507, RRAM elements 525 and 529 would be written to a high resistance state and a low resistance state, respectively, and, if the bit of the search word were a logic "0," then a low bitline voltage and high bitline voltage (e.g., ground and $V_{dd}$) would be applied to bitlines 519 and 521. As a result, when there is a match (as in this example), neither of RRAM elements 525 or 529 couple the charged matchline to ground via a low resistance path. In this example, assuming the matchline were precharged to a voltage ~$V_{dd}$, RRAM element 525 provides a high resistance state along a path between the matchline and ground, while RRAM element 529 would provide a low resistance state along a path between the matchline and $V_{dd}$. However, FET 531 in series with RRAM element 529 is off unless the wordline voltage were so high relative to matchline voltage that would drive the gate of FET 531 to at least the threshold voltage ($V_{th,531}$) of FET 531 above the matchline voltage. The wordline voltage is defined to prevent this from occurring, i.e., together with the FETs, the wordline architecture and associated control circuits provide a mechanism for preventing formation of a matchline recharge current path. Thus, the matchline discharges to ground slowly through RRAM element 525 in its high resistance state. Assuming all j memory cells in a row similarly discharge the matchline to ground though a high resistance state, the matchline is discharged by all of its cells at a relatively slow rate. Were the search bit instead a logic "1" (respective high and low voltages supplied to bitlines 519 and 521), then the matchline would discharge to ground through RRAM element 529 in its low resistance state, which provides a "quick" discharge path. Once again, provided that wordline voltage is less than the threshold voltage of FET 531 ($V_{th,531}$) above the matchline voltage, there is no recharge current path from the high-voltage bitline to the matchline because FET 527 is off in this situation. Because of the high ratio between relative resistance states, i.e., $$R_H/R_L \gg (j-1) \cdot (V_{dd} - V_{ml\text{-}min}) V_{ml\text{-}min},$$

as discussed further below, this low resistance path discharges the matchline at a much faster rate than the many high resistances (for memory cells along the row) in parallel. The difference in these relative discharge rates is readily detectable, leading to an effective CAM design. It is noted here also that, using this differential storage scheme, a "do not care" or "mask" bit can be stored as two high resistance states in the respective 1T1R "legs" of the cell 507. The result is that neither 1T1R leg of the cell rapidly discharges the matchline, irrespective of the bitline voltages.

The structure seen in FIG. 5 provides a NOR-based search architecture, that is, the matchline for any given row discharges slowly from its precharge voltage if no memory cell in the given row has a data bit that mismatches a corresponding bit of a search word, but if any one or more memory cells mismatch the search word, the matchline for the row is quickly discharged and presents a negative match result (mismatch). More discussion will follow regarding this scheme, but it should be noted at this point that other schemes are also possible, including AND-based or other match detection schemes. To provide one, simplified example, it is possible to design a cell that discharges for matches as opposed to mismatches.

An effective manner of storing data and providing TCAM functionality based on the 2×1T1R cell seen in FIGS. 3A and 5 is further explained with reference to FIGS. 6A-E.

FIG. 6A illustrates a CAM device 601 similar to the one depicted in FIG. 5, but where a row is illustrated to have only five memory cells, each numbered 603. As before, there are many other rows in the CAM device, these having been omitted from FIG. 6A to simplify the drawing. The missing rows are symbolically represented by phantom lines 611, which signify presence of these omitted rows' matchlines. It is desired to compare a specific 5-bit search word against 5-bit data stored in every row. To narrate how this is done, discussion will focus on the illustrated single row, on a specific matchline 609 and on wordline 632. Again, while only 5 cells are shown for the row, typical row length will be much larger (e.g., 160 cells), and will involve a comparison process that is a straightforward extension of the example provided using FIG. 6A. Since only 5 cells 603 are shown, each row of the CAM device is capable of storing a numeric value of 0-31. Each CAM cell 603 also receives a pair of bitlines 613 shared by cells of other rows (not shown) in the same logical column, but unique as to others of displayed cells 603. Each cell 603 is implemented in a manner that supports TCAM functionality.

A register (not seen in FIG. 6A) receives and stores the search word, and a search function is used to compare the search word "at-once" to every row of the CAM device. In this embodiment, it is assumed that comparison occurs simultaneously for all rows the of the CAM device 601. As before, comparison is performed using (a) a wordline 632 common to all CAM cells in a row, driven to a specific voltage via a voltage regulator 633, (b) a common matchline 609 initially pre-charged to $V_{ml}$ or another high voltage as indicated, and (c) an encoder 615 that receives all matchlines 611 and provides an associated output 617. A wordline decoder 634 is used to enable the wordline for every row for the search comparison, and to enable the wordline of only a selected row for a write or read operation.

The bottom of FIG. 6A illustrates ten voltages that are placed on respective ones of the bitlines 613, again, with two bitlines per cell, in response to an exemplary search word and a mask input that specifies the bits (if any) of the search word to be masked. The voltages are respectively depicted by logic values {0,1}, {1,0}, {1,1}, {1,0}, {1,0}, where a "1" represents $V_{dd}$ and a "0" represents ground. Each data bit of the search word is used by bitline control logic (not shown in FIG. 6A) to determine these voltages according to Table 1 below.

TABLE 1

| Bit value of search word | Bitline Values |
| --- | --- |
| Match "0" | {0,1} (e.g., {Gnd, $V_{dd}$}) |
| Match "1" | {1,0} (e.g., {$V_{dd}$, Gnd}) |
| Not used | {0,0} (e.g., {Gnd, Gnd}) |
| Mask column | {1,1} (e.g., {$V_{dd}$, $V_{dd}$}) |

Thus, a hypothetical search word used for comparison in this example with logic values {0,1}, {1,0}, {1,1}, {1,0}, {1,0} represents the 5 symbol digital value 01M11, where M represents a mask for a bit of the search word, i.e., for an entire column of the CAM device 601. That is, for a possible data value stored in each row of 0-31, the search function will find any specific stored data value within the search range of 11-15. Note that the result provided by Table 1 is effectively hardwired into the system, that is, bitline voltage control according to Table 1 is typically provided automatically by the bitline control logic in response to the input search word and the masking input.

Prior to the search, data has been stored as storage words in the CAM device using high and low resistance states, where a low resistance state corresponds to a "set" value. That is, in this embodiment, the data written into each individual CAM cell is represented by the resistance states of the RRAM elements as follows:

TABLE 2

| R-states | Stored info. |
| --- | --- |
| {low, high} | "1" |
| {high, low} | "0" |
| {high, high} | X, ("don't care") |
| {low, low} | Typically not used |

Note the optional support of TCAM functionality represented by the "X" or "don't care" state in Table 2, above. In contrast to the column mask function introduced by Table 1, the data-bit-to-RRAM-state mapping seen in Table 2 allows any bit of any stored data word to be masked during storage (e.g., to represent one or more ranges of values), with the corresponding bit of a search word nevertheless being applied to other rows. For example, this structure might permit storage of a data range of 11-15, with a match result produced for any specific search word within this range. Using the example of a network router, the storage location can represent a range of IP addresses, such that when a system seeks a port associated with a specific IP address within this range, the CAM device would return a CAM address that prompts selection of a port common to a range of IP addresses.

The right-most memory cell in FIG. 6A is further identified using reference numeral 637; this memory cell provides the basis of discussion in FIG. 6B, where the cell 637 is illustrated in enlarged detail. In particular, bitlines 613 for the cell are labeled 639 and 641, respectively. Bitlines 639 and 641 are assumed to carry values of "1" ($V_{dd}$) and "0" (ground), respectively, that represent a specific search word bit with a value of "1" (see Table 1, above). The wordline 632 is assumed charged, so that the FET 643 of this cell 637 is enabled, and the matchline 609 is also assumed to be charged to $V_{ml}$. It is additionally assumed that wordline 632 is charged to a voltage less than $V_{ml}$+the threshold voltage $V_{th,645}$ of the FET 645 connected to the high-voltage bitline 639 so that FET 645 is off. Note that: (1) the matchline voltage cannot charge towards the voltage on bitline 639, as the FET 645 is off (there is also no substantial voltage drop across the bistable element and switch that connects matchline 609 to this bitline 639 (i.e., $V_{ml} \sim V_{dd}$, $V_{ml} - V_{dd} \approx 0$)); and (2) the matchline voltage will discharge towards the voltage on bitline 641 ($V_{ml} - 0\text{volts} = V_{ml}$, i.e., current will flow) at a rate depending on the resistance of RRAM element 647 and the RC characteristics of the matchline as a whole. That is to say, if RRAM element 647 has a low resistance, then the CAM cell 637 discharges the matchline at the "quick" rate, and if RRAM element 647 has a high resistance, then the matchline will be discharged at a slow rate.

Discrimination between discharge rates will be discussed further below, but to facilitate the introduction of the matchline sensing methodology, it should initially be assumed that each RRAM element provides idealized operation, that is, such that every cell 603 from FIG. 6A either grounds the matchline (in the case of a mismatch against a bit of a search word) through a low resistance or represents an "open circuit" that does not discharge the matchline at all (i.e., in the case of a match).

Recall that in the example of FIG. 6A, values {0,1}, {1,0}, {1,1}, {1,0}, {1,0} represent the 5 symbol digital value of 01M11. If the row of cells 603 depicted by FIG. 6A is assumed to store the number 15 (equal to binary 01111), then the matchline would not be discharged, because there would be no mismatching cell and consequently no low resistance path to ground. Cell 637 in particular does not discharge the matchline, because in this idealized example, the cell stores a binary "1." According to Table 2, bitline 639 cannot discharge the matchline because its high voltage ($V_{dd}$) prevents the wordline voltage from turning FET 645 on. In contrast, bitline 641 has a low voltage and RRAM element 647 has a high resistance state, represented as an open circuit (again, using idealized representation).

Figure 6C:
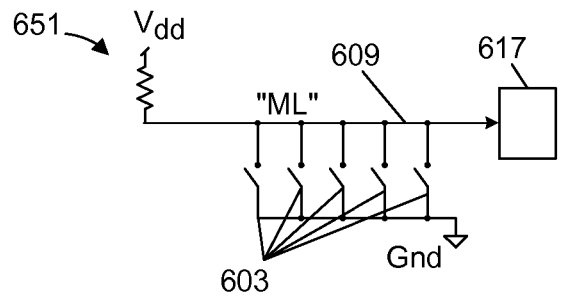
FIG. 6C shows a simplified "NOR" sensing structure corresponding to the example introduced in FIG. 6A.

This idealized, open/closed circuit analogy is represented in FIG. 6C as a wired NOR switch structure 651, where each particular bit is modeled as an individual switch that is closed if the bit mismatches a corresponding bit of the search word. As exemplified, a voltage source charges matchline 609, which in turn is coupled to encoder 617. In the event that each stored data bit matches a corresponding search word bit, the corresponding switch remains open. Otherwise, the particular memory cell 603 couples the matchline to ground and the representative switch is effectively closed, shorting the matchline as a whole to a ground. Thus, the encoder 617 receives $V_{ml}$ on matchline 609 in the case of a match and receives 0 volts (i.e., ground) if any one or more bits of the stored data word are different from corresponding bits of the search word. In this analogy, a mask or "X" state in a TCAM cell in the row is the equivalent of forcing a specific one of the five depicted switches "open." It is again noted that alternatives to this NOR logic structure 651 are possible, with the encoder detecting matches or mismatches on the basis of OR, NAND, AND or other (e.g., more complex) logic configurations.

Figure 6D:
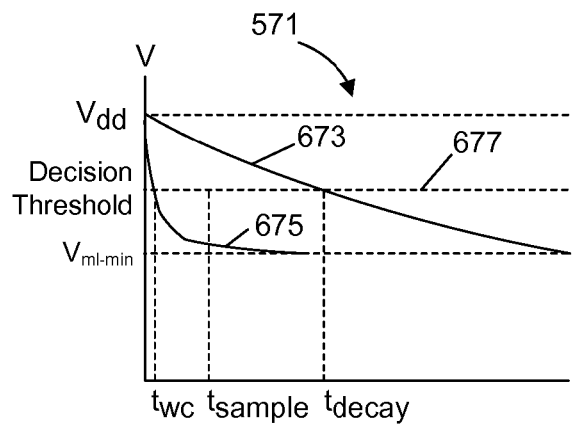
FIG. 6D shows a voltage decay curve associated with matchline sensing.
Figure 6E:
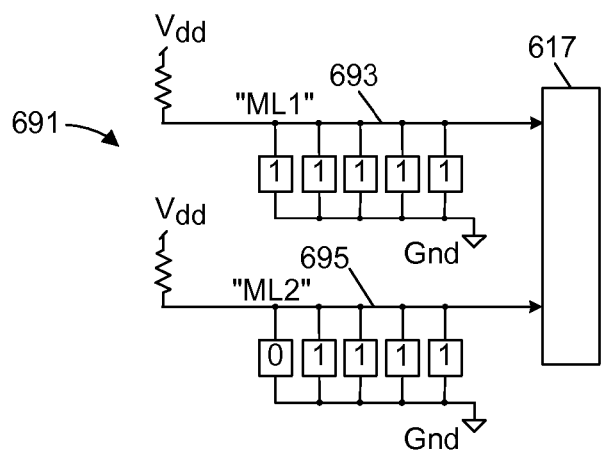
FIG. 6E shows an embodiment of a calibration circuit used to determine an appropriate sampling time, $t_{sample}$, identified in the curve of FIG. 6D.

While idealized operation is helpful to illustrate basic operating NOR architecture, the memory cells from FIG. 6A typically discharge the matchline at a slow rate even when the CAM row exactly matches a search word; that is, the high resistance discharge paths of "matching cells" still discharge the matchline, albeit at a slow rate. FIG. 6D is therefore used to further explain matchline sensing based on discrimination between RC discharge characteristics. In particular, FIG. 6D presents a voltage-time graph 671 where the "match" condition (slow discharge) is represented by a first curve 673 and a "worst case mismatch" condition is represented by a second curve 675. The term "worst case mismatch" refers to the fact that the "slowest" mismatching discharge case is presented when only a single bit of the stored data word mismatches the corresponding bit of the search word and all other bits for the row match the corresponding bits of the search word. If more than one bit is mismatched, there would be a corresponding number of low resistance paths to ground, and the matchline would discharge faster than the rate represented by curve 675. Thus, by measuring the voltage on the matchline at an appropriate sampling time ($t_{sample}$) after the time the wordline voltage is asserted, and by applying a decision threshold based on curves 673 and 675, to the matchline voltage, a match can readily be differentiated from any mismatch. That is, during search, if the matchline voltage is sampled at time $t_{sample}$ after the time that the wordline voltage is asserted to enable FETs in all the rows and the matchline voltage is found to be above the decision threshold, a match is determined to exist. Conversely, if the matchline voltage is less than the decision threshold at time $t_{sample}$, a match is determined not to exist between the data stored in the row and the search word.

A number of methodologies exist for determining $t_{sample}$. In a simple case, $t_{sample}$ can simply be dead reckoned for a particular design implementation. In other embodiments, $t_{sample}$ can be calibrated dynamically and/or updated to account for PVT variation. To provide a few examples, $t_{sample}$ can be taken as the approximate middle of $t_{match}$-$t_{wc}$, where $t_{wc}$ represents a time associated with predetermined decay of matchline voltage for the "worst case mismatch" curve 675, and where $t_{match}$ represents a like measure for voltage decay in the case of a match. A predetermined delay of the matchline voltage in this context can mean decay equal to a dead reckoned voltage or a predetermined voltage difference, or decay as a function of starting matchline voltage (e.g., as a percentage of this voltage); other measures may also be used. Alternatively, statistical methods may be employed based on measurement of $t_{match}$ and $t_{wc}$ or other measured parameters to identify an optimal "data eye" sampling point relative to the possible RC time decay curves. Note that this optimal sampling point (or "sampling time") might not necessarily be at the middle of $t_{decay}$-$t_{wc}$. A suitable sampling time can also be computed based on maximum voltage difference between curves 673 and 675, or based on a reference current. As should be appreciated, the choice of a specific methodology will depend on design constraints, and many other alternatives exist for discriminating a match state from a mismatch state.

One structure for determining the decision threshold and the optimal sampling time is schematically depicted in FIG.

6E, which shows an equivalent representation 693 of the matchline sensing operations on two different rows of cells. The matchline operation 693 on a first row represents a match and produces a matchline voltage decay characteristic "ML1," while the matchline operation 695 on the second row represents a worse-case mismatch and produces a matchline voltage decay characteristic "ML2." In the example shown, a "0" represents a low resistance path to ground. The decision threshold can be taken to be the mid-point between voltages of decay characteristics ML1 and ML2 at a sampling time $t_{sample}$ determined according to one of the methodologies described above. Relative to this figure, the two sensing operations 693 and 695 can be effected by reserving and testing a dummy row during a calibration routine. Another possible scheme is to provide for a dummy reference row that has its bitlines tied low with high resistance states in half of the cells, and simply measure when voltage for an associated matchline decays to a specific threshold. Other variations naturally exist; in one embodiment, a dummy row can be used to calculate a sample time, a threshold voltage, a reference voltage or a reference current, for example, to determine appropriate state discrimination parameters. In another embodiment, such calibration can be performed on a row actively used in storage of live data. The use of a dummy row or a live row for calibration operations, and associated array control (e.g., via firmware, memory controller command, dedicated array circuitry, or any combination of these things) is referred to as means for reserving at least one non-addressable row of the CAM device. The function that periodically calibrates at least one of (a) a sampling time, (b) a decision threshold, (c) a reference voltage or (d) a reference current can be performed by similar "means," that is, via firmware, within or under the command of a memory controller command, dedicated array circuitry, or any combination of these things. To provide one example, a hardware circuit such as a comparator or analog-to-digital converter can be used to determine a voltage or time as referred to above by facilitating comparison of an empirically-measured parameter against a threshold.

With an appropriate sampling time and decision threshold calculated, a search can be conducted according to the following sequence:
Initialize:
a) Raise all bitlines to $V_{dd}$;
b) Precharge matchlines to $V_{ml} \approx V_{dd}$; and
c) Drive all wordlines to an appropriate wordline enable voltage (e.g., within the range of $V_{th1}$ to $V_{ml-min}+V_{th2}$ as described below with reference to FIG. 9).
Search:
a) Drive bitlines to states defined by respective bits of search word (e.g., ground for some bitlines);
b) Release matchline precharge;
c) Matchline state detect; and
d) End.

Variations of the bitline versus matchline timing at the start of the search operation and during precharge are possible to minimize crowbar current through the cells. Note that as represented in Table 1, above, the value {1,1} can used to selectively mask an entire column of cells during comparison, that is, placing $V_{dd}$ on both bitlines associated with a column ensures that no CAM cell associated with that column discharges one of the device's matchlines.

Figure 7:
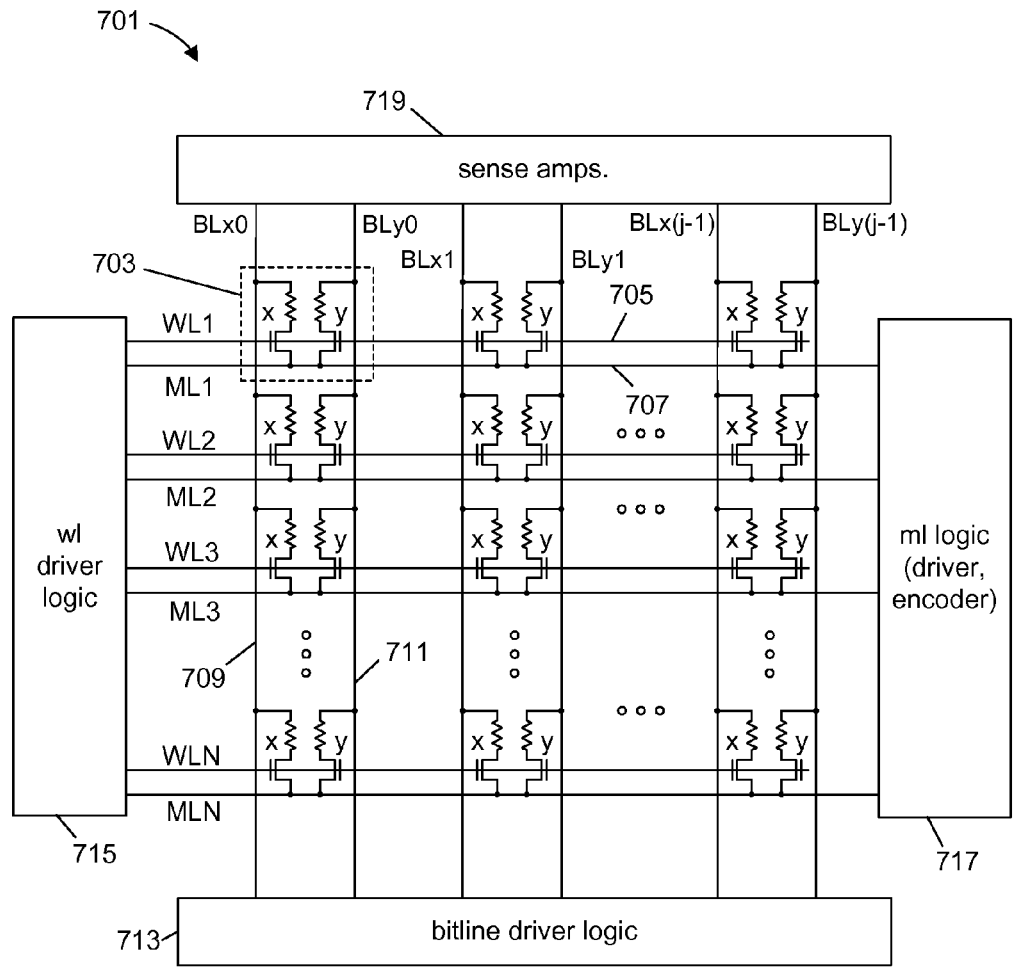
FIG. 7 shows a block diagram for another embodiment of a CAM, namely, one that uses resistance switching devices (such as resistive random access memory "RRAM" elements) as the bistable element of each memory cell.

FIG. 7 presents additional detail regarding the structure of a memory core 701 and how wordline control logic, bitline control logic, matchline logic and sense amplifiers interact using the various bitlines, once again, based on a 2-RRAM element architecture. In particular, each memory cell (such as exemplary cell 703) is seen to include two RRAM elements (labeled "$R_x$" and "$R_y$") and two associated FETs, with each RRAM element-FET pairing providing a series-coupling between a matchline 707 and a respective bitline 709 or 711. Each FET for the cell 703 is controlled via a wordline ("WL") 705, consistent with the principles introduced earlier. Note that this wordline 705 and the matchline 707 are also shared by all cells' FETs for the row in question (e.g., "row 1"). As with several of the devices described above, there are N rows and j columns, with each column having a pair of bitlines $BL_x$ and $Bl_y$, respectively, for a total of 2*j bitlines (labeled $BL_{x,0-j}$ and $Bl_{y,0-j}$). Note that as mentioned above, instead of driving a given pair of bitlines across an entire memory array in response to a given bit of the search word, the bitlines can be segmented, with bitline segments driven simultaneously or in a slightly staggered manner.

The memory cells illustrated in FIG. 7 can be separately written to, read, refreshed, or searched using the respective matchlines, wordlines and bitlines. Bitline driver logic 713 is used to apply voltages on the bitlines to set and reset the individual RRAM elements ($R_x$ or $R_y$) such that a current flows to or from these bitlines for any selected row; the wordline and the matchline are controlled by wordline driver logic and matchline logic 715 and 717, respectively, to select a specific row, and to apply suitable voltage to cause an appropriate current to flow between a matchline for a selected row and each intersecting bitline. As mentioned, the procedure and voltages, currents and polarities applied will generally vary depending on the type of RRAM or other bistable technology used. As previously described, RRAM elements ($R_x$ and $R_y$) provide TCAM functionality by storing information in accordance with Table 2, described earlier, responsive to current flows between the matchline and respective bitline.

To write data into exemplary cell 703, bitlines $BL_{x,0}$ and $Bl_{y,0}$ are raised by bitline driver logic 713 to respective voltages. As mentioned in accordance with Table 2, at least one RRAM element will typically be set to a high resistance state. To cause one of the elements to be reset to adopt a high resistance state (e.g., from a prior low resistance state), the corresponding bitline is tied to a low voltage (e.g., ground) and the matchline is raised to an intermediate voltage $V_{reset}$; should any RRAM elements for the row need to be set to the low resistance state, then the corresponding bitline is set to $V_{reset}+V_{set}$. Assuming the use of a solid state electrolyte material as mentioned above (e.g., where opposite polarities are used for set and reset), the opposite polarity voltages will cause each RRAM element for the desired row to adopt the desired state. Note that this occurs with (a) a common wordline voltage sufficient to turn on all FETs for a row being written-to, and (b) a common matchline voltage (at $V_{reset}$) for the entire row being written-to.

To the extent necessary for the specific form or memory, refresh operations may also optionally be performed to increase the time with which a memory device stores data. Refresh of a row of the memory core 701 is analogous to a write operation. That is to say, data is read out of a row into a buffer and then is rewritten back into the same row using the write operation just described. This type of operation can be performed for a single row or on a burst basis.

A read command proceeds in the manner introduced above; first, bitline voltages are initialized to predetermined values such as ground; as this happens, a desired address is provided to wordline control logic. The pertinent matchline 707 and wordline 705 are then raised to appropriate values, for example, $V_{ml} \approx V_{dd}$ in the case of both the matchline and the wordline (e.g., sufficient to enable FETs for the selected row). With the desired row enabled, the precharge on the bitlines is then released. With a voltage appearing across the cell, the resulting bitline current changes in accordance with cell content, and the result current is read using voltage or current sensing schemes. A suitable decision threshold can be used to differentiate high versus low resistance state for each RRAM element being measured. These thresholds can be dead reckoned by the designer, or based on use of a reserved dummy row or a live row, with threshold being established row-wide or bitline by bitline. If the decision threshold or thresholds are dynamically calculated, the calculation can be based on measurement of a sampling time, a dynamically measured decision level, or some type of reference voltage or current measurement.

To provide for a row or block erase function (that is, without specification of write data), each cell can be written-to to have the same resistance patterns, e.g., $R_x/R_y$=H/L. This type of function can be provided on a row basis by causing the wordline decoder to assert the appropriate wordline, and by causing bitline driver logic 713 to provide the appropriate states on the respective bitlines for each cell. Note that a block erase can be provided by segmenting wordline activation, such that a group of wordlines is enabled at-once or in close succession.

A search function proceeds in the manner that has already been described, that is, by causing wordline control logic to simultaneously or in close succession enable all rows of the memory core, and by pre-charging all associated matchlines. The bitlines are also switched to carry voltages defined by respective bits of the search word; the memory cells for each row then effectively compare a bit of the search word with their contents, and a row-based match result is indicated on the associated matchlines. As part of matchline logic 717, matchline amplifiers compare matchline voltage to a decision threshold at the sampling time, and a priority encoder outputs an address of a row having data that matches the search word, or an appropriate indication that there is no address with data matching the search word. Once again, the priority encoder can output a single address (in the event of multiple hits) or multiple addresses in a specific order.

Note that as described above, a number of different thresholds and reference voltages and currents are used within the CAM device for various functions; these can, as stated, be empirically determined by the designer (i.e., dead reckoned) or can be calibrated during operation, using a dummy row or "live" rows as indicated above. Calibration procedures can be performed at device power up, or periodically, for example, to account for PVT variation.

III. Management of the Recharge Current Path

One challenge associated with design of a CAM or TCAM based on resistance switching technology is management of a possible recharge current path. As mentioned above, in a system that relies upon discriminating changes in current or voltage based on resistance, the existence of a "recharge path" can interfere with effective discrimination by resupplying charge to the matchline during a time when the CAM or TCAM is attempting to detect matchline discharge.

This problem is illustrated with reference to FIG. 8, which shows an exemplary set 801 of RRAM-based CAM cells, including left-most cell 803 and a right-most cell 804. These cells represent any number of cells or RRAM devices for a CAM row, i.e., they are presented to illustrate issues associated with matchline state detection in a hypothetical CAM or TCAM embodiment. In this example, it is assumed that it is desired to sense the discharge rate of the row represented by these cells; by way of illustration, this can be taken to be the first row identified in FIG. 7. Cell 803 is therefore crossed by a wordline and matchline for the row, 805 and 807 respectively, and by two column bitlines $BL_{x,0}$ and $BL_{y,0}$ for one column, 809 and 811, respectively. Cell 804 is crossed by the wordline 805 and matchline 807 and by two different column bitlines $BL_{x,1}$ and $BL_{y,1}$ for the next column, 810 and 812, respectively. In this example, it should be assumed that the left-most cell 803 stores low and high resistances in its "$R_x$" and "$R_y$" RRAM elements, or a binary "1" according to Table 2. The right-most cell 804 stores high and low resistances in its "$R_x$" and "$R_y$" RRAM elements, or a binary "0" according to Table 2. If the left-most cell 803 is compared to a binary "0" during search, the content of cell 803 will mismatch the search word; as a consequence, the low resistance path of cell 803 will discharge the matchline 807 through "R-low" and FET 825. A discharge current that flows through this path is represented by current flow arrow I-dis in FIG. 8. Similarly, if the right-most cell 804 is compared to a binary "0" during search, the content of cell 804 will match the search word; as a consequence, the high resistance path of cell 804 will only slowly discharge the matchline 807. As contrasted with current flow I-dis, the high resistance discharge path represented by the $R_x$ RRAM element of cell 804 is overlaid with an "X," to signify the relative lack of current flow.

Because of very high discrimination between resistances provided by RRAM elements for these cells, it is assumed for purposes of discussion that high resistance state "R-high" in the cells 803 and 804 respectively provide an idealized case of no current flow, and the respective current flow paths through the cells are therefore overlaid with an "X" to indicate this fact. Initially, FET 831 connected to the high-voltage bitline $Bl_{y,1}$ in the next column (at cell 804) is off, and no recharge current flows from high-voltage bitline 812 to matchline 807. However, once the voltage on matchline 807 falls below the voltage on wordline 805 by the threshold voltage of FET 831, FET 831 turns on and provides a low resistance current flow path R-low between a high voltage bitline 812 and the matchline 807. Current supplied via this path recharges matchline 807, and changes the rate at which matchline 807 discharges and in some circumstances prevents the matchline from quickly discharging, either of which potentially affects the matchline voltage during comparison with the decision threshold at the sampling time. The recharge current path is represented by current flow arrow I-lk in FIG. 8.

It will be recalled that in the case of a typical row (e.g., 160 cells wide) the bits stored in any number of cells may mismatch the corresponding bits of the search word, and system design should be robust enough to easily distinguish this situation from a case where all cells match. If 1 to (N−1) "mismatching" cells each provide a discharge current (I-dis) but (N−1) to 1 "matching" cells each provide a recharge current (I-lk), then the potential exists for this condition to mimic a match state. This is because the recharge current, I-lk, can prevent the discharge current, I-dis, from discharging the matchline below the decision threshold (FIG. 6D) by the sampling time $t_{sample}$. Absent proper design safeguards, some system implementations therefore might falsely detect a "match" via the matchline even though it should in proper operation detect a mismatch.

Embodiments of this disclosure address undesired matchline recharge by defining the wordline voltage to prevent the formation of recharge current paths between the high-voltage bitlines and the matchline for each row. This can be achieved by setting the wordline to a voltage that turns on the FETs connected to low-voltage bitlines but holds off the FETs connected to high-voltage bitlines throughout a discharge voltage range defined for matchline 807. Holding off the FETs connected to high voltage bitlines ensures that no recharge current can flow from such wordlines to the matchline. For example, FIG. 8 shows a number of possible nodes 813, 815, 817 and 819 through which current can flow to matchline 807. Each of these nodes is coupled by an FET 825, 827, 829 or 831 to an associated bitline. No recharge current can flow to matchline 807 through nodes 815 and 817 and associated FETs 827 and 829 since these FETs are series-coupled with high resistance RRAMs. Nodes 815 and 817 will therefore be disregarded. Also, because FET 825 couples the matchline 807 to bitline 809 at ground via node 813, it is desired to detect this discharge. However, once the voltage on matchline 807 falls below the voltage on wordline 805 by the threshold voltage $V_{th}$ of FET 831, the high-voltage bitline 812 (at a voltage of, e.g., $V_{dd}$) is coupled through a low-resistance RRAM and FET 831 to the matchline through node 819. Depending on the number of matches and mismatches, any number of low resistance paths $z_1 < j$ can discharge the matchline, and any number of low resistance paths $z_2 < j$ can couple the matchline to a respective high voltage bitline, where $z_1 + z_2 = j$. This can create a potentially unpredictable discharge rate on the matchline.

This situation is advantageously addressed by setting the wordline voltage to turn off each FET when the bitline connected thereto is a high-voltage bitline, to prevent the FET from providing a recharge current path (such as provided by FET 831 and the low-resistance RRAM element connected thereto via node 819) to the matchline. These FETs will be in an off state provided that the wordline voltage is less than $$V_{ml\text{-}min} + V_{th2},$$

where $V_{ml\text{-}min}$ is the minimum voltage to which the matchline is allowed to discharge during comparison against the states of the bitlines, and where $V_{th2}$ is the threshold voltage of the FETs 825, 827, 829, 831 (assumed to have nominally identical characteristics) under high $V_{ds}$, low $I_{ds}$ operating conditions similar to those of FET 831. Additionally, to ensure that FETs connected between the low-voltage bitlines and the matchline through respective RRAM elements in the low-resistance state turn on as intended, the wordline voltage should be greater than $V_{th1}$, where $V_{th1}$ is the threshold voltage of the FETs under low $V_{ds}$, high $I_{ds}$ operating conditions similar to those of FET 825. Thus, the permissible range of wordline voltage $V_{wl}$ is:

$$V_{th1} < V_{wl} < V_{ml\text{-}min} + V_{th2}.$$

A wordline voltage in this voltage range is low enough prevent the gate voltage of FET 831 becoming greater than the minimum matchline voltage $V_{ml\text{-}min}$ on the source of FET 831 by more than the threshold voltage $V_{th2}$ pertaining to the operating conditions of FET 831. Moreover, a wordline voltage in this voltage range is at least equal to the threshold voltage $V_{th1}$ pertaining to the operating conditions of FET 825, so that application of the wordline voltage to the gate of FET 825 establishes the matchline discharge path through node 813. Provided the wordline voltage meets the above-stated conditions, the FET gate voltages turn off all recharge current paths for the row, and matchline 807 can discharge quickly, as discussed above in connection with FIG. 6D.

An additional constraint already mentioned is that the discrimination between resistive states should be such that $$R_H/R_L \gg (j-1) \cdot (V_{dd} - V_{ml\text{-}min})/V_{ml\text{-}min}.$$

Note that the designer determines $V_{ml\text{-}min}$ based on the process and device characteristics; in other words, the wordline voltage will have a value in the mismatch state that depends both upon the particular design, as well as upon the number of mismatching cells. The equation set forth above for discrimination between resistance states expresses the relation that the RRAM elements used for each memory cell are typically designed to provide a high discrimination between resistance states, high enough such that irrespective of "worst case" mismatch wordline voltage drop and a large number j of cells per row, a match case is still easily discriminated from a worst case mismatch. A typical value for this state discrimination is expected to be on the order of 50:1, with as high a resistance ratio as possible being preferred, e.g., 100:1 or greater.

Figure 8:
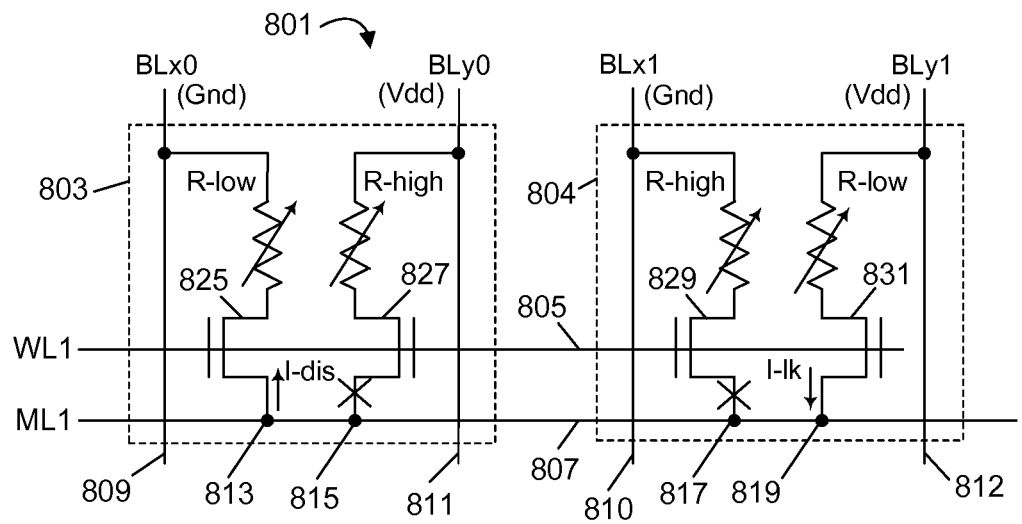
FIG. 8 provides a schematic close-up of two cells of a CAM.
Figure 9:
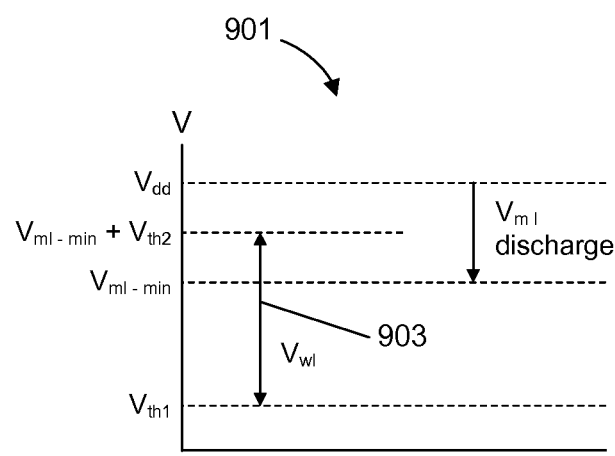
FIG. 9 is a voltage diagram used to further explain wordline control or regulation.

FIG. 9 provides a voltage graph 901 showing the various relationships between $V_{dd}$, $V_{ml\text{-}min}$, $V_{wl}$, $V_{th1}$ (corresponding to operating conditions of FET 825 from FIG. 8) and $V_{th2}$ (corresponding to the operating conditions of FET 831 from FIG. 8). As indicated, if the wordline voltage is within the range associated with arrows 903, formation of the recharge current path is prevented, subject to the resistance state discrimination assumptions just discussed.

IV. Cooperation Between a CAM and RAM; Single IC Implementation

It was mentioned earlier that one market for conventional CAM devices is in the field of network routers. In this field, there is a definite need for devices that can match an input packet against different stored IP addresses or IP address ranges to determine how best to route packets; the output from the router in this case is not just a CAM row address, but rather, a packet routed in an appropriate manner. That is, the router must typically parlay a CAM match (e.g., an IP address match) to an appropriate destination, such as an outbound port of the router. Conventionally, therefore, a router might feature a CAM integrated circuit device ("IC") and a RAM IC, formed using different processes and/or technologies, where the address output by the CAM IC is input to the RAM IC via circuit board traces; the RAM IC retrieves a port number, and this information is then output to the other logic elements of the system. Of course, wide area network ("WAN") devices such as routers are not the only applications for this type of logic structure, i.e., there are a class of applications where a CAM device can be coupled with a RAM output; WAN based applications are, however, an important application for a CAM device.

One embodiment of this disclosure therefore provides an apparatus that includes both a CAM array and a RAM array in a single device, such as a single IC. A second, more particular embodiment, however, provides even further benefits—with the CAM array and the RAM fabricated according to a common process technology, e.g., based on RRAM elements, with resultant RRAM arrays that can be inexpensively fabricated integrated on a single die with highly efficient space layout (e.g., using the same process technology, in one manufacturing process); this second embodiment therefore facilitates low cost fabrication of a single IC using a minimal number of different fabrication processes.

FIG. 10 shows an apparatus 1001 having both a CAM portion 1002 and a RAM portion 1003, optionally produced as a single standalone die or IC.

The CAM portion 1002 is seen to be of the same design as presented earlier in FIG. 6, that is, it interfaces with CA and DQ links 1005 and 1007, respectively, and has a core based on an RRAM array 1009. The core is managed by control logic, wordline control logic, bitline control logic and voltage generation circuitry, 1011, 1013, 1015 and 1017, respectively, just as was described earlier. These elements help provide the write, erase, read, refresh and other memory functions. In addition, buffers 1023, sense amp array 1025 and data IO 1027 help exchange data with a memory controller or other circuitry. Note however that matchline amps and encoder logic 1019 and 1021 are seen in phantom lines—by integrating the CAM and RAM functions on a single die, it becomes possible to partially or entirely omit this circuitry and instead directly couple matchline output to a RAM core. That is to say, instead of encoding the matchline output to obtain an address, providing that address to a RAM, and then outputting data found at a consequent RAM address, the matchlines themselves can be directly fed to the RAM and used for row activation as represented by numeral 1022. Individual matchline output is simply passed through appropriate enable logic and driver logic and used to directly access corresponding rows of RAM, thereby greatly reducing die overhead. Note that the RRAM array 1009 within the CAM portion 1002 can still be dynamically programmed and read using CA bus 1005 and DQ bus 1007, as can the RAM array. Also note that because the RAM can itself be an RRAM array, the entire circuit can be fabricated using one process technology with two highly similar cell designs.

In a network routing application, apparatus 1001 can be embodied as a network router including numerous other logic circuits to handle the various functions of a router; inbound and outbound arrows 1031 and 1033 in this context symbolize the flow of packets into an out of apparatus 1001, respectively, each via one or more ports. Other applications are also possible.

As alluded to at the beginning of this disclosure, by providing design of compact, relatively low-power CAMs and TCAMs, the teachings of this disclosure potentially facilitate design of more compact, more efficient, larger memories, and potentially decrease the cost of these devices in network routers and other applications.

V. Methodology and CAM Implementation, Revisited

FIG. 11 provides a block diagram 1101 showing one method implementation of teachings provided by this disclosure. As represented by block 1103, a bit of information is stored in a CAM cell using different resistive states. To provide a search function, per process blocks 1105, 1107 and 1109, the matchline is set to a first voltage, a bitline is set to a second voltage, and a current is allowed to flow through resistance switching element(s) in a manner that permits identification of matchline state.

The right side of FIG. 11 shows a number of dashed-line or optional method block elements, 1111-1121. For example, as denoted by block 1111, each bit of information can be stored using differential resistive states, that is, using two resistance switching memory elements per cell. As this mention implies, TCAM functionality is thereby also supported, because two "high" resistive states are supported by the same cell design to indicate a match during search, irrespective of bitline voltages. Per block 1113, the resistance switching memory element(s) used in each cell can include any device where different states are represented by relative resistances, such as RRAM, MRAM, PCRAM, or other structures, as they are variously known in the industry. As further borne by boxes 1115 and 1117, the two voltages used to sense matchline state can optionally be $V_{dd}$ and ground, respectively, although use of other voltage references is also possible. Box 1119 shows that optional wordline control is also advantageously applied, to facilitate match state discrimination by preventing the formation of a recharge current path. Finally, per box 1121, a NOR logic structure for matchline detection is used in some of the described designs, but other logic structures such as an AND design or more complex logic structures are also possible.

IV. Conclusion

What has been described is a set of techniques, methods and related designs for producing high-density CAM cells. Many of the described embodiments also support TCAM functionality with no appreciable increase in device size relative to CAM design. As described above, these devices can use a bistable element and a switch, connected in series between a matchline and a bitline. The switch can be controlled, for example, using a wordline voltage, such that the switch provides a conductive path through the bistable element dependent upon a state of the bitline; this state can be the condition when the bitline voltage is substantially higher than the matchline voltage, such as when the bitline voltage is greater than $V_{ml\text{-}min}+V_{th}$. In one embodiment, these devices use an RRAM element as the bistable element and a FET as the switch, in a "two leg" configuration. Also described have been techniques, methods and designs for fabricating a combination CAM/RAM device based on a single device technology, for example, implemented in a single die. Other applications will be readily apparent in view of the teachings provided above, or in view of the invention defined by the claims set forth below.

To provide a few further examples, instead of using RRAM elements, other types of nonvolatile or volatile memory elements can be used. Although known by a variety of names, many forms of bistable elements have properties where resistance change is a manifestation of some type of change in physical materials. For example, RRAM, magnetic random access memory (MRAM), phase change random access memory (PCRAM), nanowire RAM, and similar designs all operate based on similar state change principles where the current that flows through the material (or equivalently, voltage drop seen across the material) changes depending on state of the underlying materials. Therefore, in many of the detailed examples provided above, RRAM elements are used, but as mentioned, other designs are possible.

In addition, it should also be noted that matchline sensing architecture presented above was primarily on "NOR" architecture, that is, where a match is detected based on matchline voltage if no one or more cells discharge the matchline; other designs are, however, possible. That is, other designs, such as based on "OR," "AND," "NAND" and more complex logic architectures are also contemplated.

Also, while a two "leg" structure has been described, it is also conceivably possible to implement the techniques described above in a one "leg" (1T 1RRAM) cell architecture, that is, where only CAM functionality is provided. As an example, one can potentially sense state of cells in such a structure (e.g., RRAM element state) by performing multiple sensing steps, for example, by regulating wordline voltage as has been described above to identify whether any RRAM elements couple a matchline to a low voltage bitline and then, in a second step, by raising wordline voltage so as to determine whether any RRAM elements couple the matchline to a high voltage bitline.

As should also be apparent, voltage mode operations have been generally described above, but it should be readily understood that current mode techniques may be used for this sensing, depending on desired design.

Finally, several techniques presented above used substantially simultaneous comparison between a search word and all storage locations in an array, i.e., ideally in a single clock cycle. Several expressly contemplated alternatives include sensing blocks of storage locations in a manner sequentially segmented to multiple sub-arrays (e.g., using a small number of clock cycles), or providing command support to search one or more specific sub-arrays of a memory device instead of all storage locations in a memory device. In an embodiment where only a subset of the array is searched, a number of different architectures may be equivalently used, including architectures that inhibit (or ground) matchlines outside of a selected subset, to effective force a mismatch result for rows not part of the selected subset.

Accordingly, the foregoing discussion is intended to be illustrative only; other designs, uses, alternatives, modifications and improvements will also occur to those having skill in the art which are nonetheless within the scope of the present disclosure, which is limited and defined only by the following claims and equivalents thereto. Again, these options are also contemplated by the foregoing description.

We claim:

1. An apparatus comprising a content addressable memory (CAM) cell, the CAM cell comprising:
    a first bistable element and a first switch coupled in series between a first bitline and a matchline;
    a second bistable element and a second switch coupled in series between a second bitline and the matchline; and
    a control input for the first switch to selectively control a conductance state of the first switch in dependence upon a state of the first bitline;
    a control input for the second switch to selectively control a conductance state of the second switch in dependence on a state of the second bitline;
    where the control input for the first switch is to inhibit conduction by the first switch which recharges the matchline, and where the control input for the second switch is to inhibit conduction by the second switch which recharges the matchline.

2. The apparatus of claim 1, where each of the first bistable element and the second bistable element includes one of a phase-change, magnetic-switching or a resistance switching memory element.

3. The apparatus of claim 1, where each of the first bistable element and the second bistable element includes a RRAM element.

4. The apparatus of claim 1, where:
    the apparatus is further embodied as a device comprising columns and rows forming an array of memory cells, each one of said memory cells forming an instance of said CAM cell, the matchline of each memory cell in a given row being shared by all memory cells in the given row, the first bitline and the second bitline for each memory cell in a given column being shared by all memory cells in the given column; and
    the apparatus further comprises a match detection circuit to identify a condition where stored data content of memory cells in a row match respective bits of a search word.

5. The apparatus of claim 4, where:
    each bistable element of each memory cell comprises a resistance switching element; and
    the matchline detection circuit is to discriminate between a first state and a second state of each matchline where, in the first state, no resistance switching element of any memory cell in the row conducts in a first resistance state between the corresponding matchline associated with the row and a corresponding bitline when the corresponding bitline is at a lower voltage than the matchline and where, in the second state, a resistance switching element of one or more of the memory cells in the row conducts in the first resistance state between the associated matchline and the corresponding bitline when the corresponding bitline is at a lower voltage than the matchline.

6. The apparatus of claim 5, where each resistance switching element has a state of lowest resistance and the first resistance state is the state of lowest resistance for each resistance switching element.

7. The apparatus of claim 4, where, in event the condition is detected, the match detection circuit is to output an address of at least one row having contents that match corresponding bits of the search word.

8. The apparatus of claim 1, where the apparatus further comprises a non-CAM memory to output a data value stored in the non-CAM memory in dependence upon a state of the matchline.

9. The apparatus of claim 8, further embodied in a network router, the non-CAM memory to output a port identifier as the data value in dependence upon the address provided by the match detection circuit.

10. The apparatus of claim 8, where:
    the apparatus is further embodied in an integrated circuit; and
    the data value in the non-CAM memory is programmable.

11. The apparatus of claim 8, where each memory cell in the array, and each memory cell in the non-CAM memory, comprises an RRAM device.

12. The apparatus of claim 1, further comprising a row having at least one instance of the CAM cell dedicated to calibration of at least one of (a) a sampling time for detection of the condition, (b) a decision threshold, (c) a reference voltage or (d) a reference current.

13. The apparatus of claim 1, where the first switch and the second switch are field effect transistors (FETs) and where the control input for the first switch and the control input for the second switch are provided by a wordline coupled in common to a gate of each of the FETs.

14. The apparatus of claim 13, where the wordline is to apply common voltage to both of the FETs to compare content of the CAM cell against the states of the bitlines, the common voltage lies within a voltage range defined by $\{V_{th1}, V_{ml-min}+V_{th2}\}$, where $V_{ml-min}$ is the minimum voltage to which the matchline is allowed to discharge during comparison against the states of the bitlines, where $V_{th1}$ is the threshold voltage that turns on FETs which couple the matchline to a low voltage bitline, and where $V_{th2}$ is the threshold voltage which turns on FETs which couple the matchline to a high voltage bitline.

15. A content addressable memory (CAM) device, comprising:
    a matchline;
    memory cells coupled to the matchline, each memory cell comprising two resistance switching memory elements, each resistance switching memory element having two stable states;
    bitlines, each resistance switching memory element coupling a respective bitline to the matchline;
    logic to store a bit of data in each given memory cell in the form of a differential resistance state between the two resistance switching memory elements for the given memory cell; and
    logic to compare a bit of a search word against a corresponding bit of data stored in one of the memory cells by applying a differential voltage between the two respective bitlines;

where each memory cell further comprises a switch for each resistance switching memory element, each switch controlled to selectively gate current flow through the associated resistance switching memory element in a manner to inhibit recharge of the matchline.

16. The CAM device of claim 15, where the logic to compare is to compare at least one bit of the search word against content of one or more corresponding memory cells by (a) pre-charging the matchline, and (b) applying the differential voltage between the two respective bitlines of each memory cell of the one or more corresponding memory cells, such that one of the two respective bitlines for each of the one or more corresponding memory cells discharges the matchline when the corresponding content does not match the corresponding bit of the search word.

17. The CAM device of claim 15, embodied in an integrated circuit memory device.

18. The CAM device of claim 17, where both of the switches are controlled in common for each memory cell.

19. The CAM device of claim 17, where each switch includes a field effect transistor (FET) having a gate, and the gates of both FETs for a memory cell are controlled in common in dependence on a wordline voltage.

20. The CAM device of claim 19, where the wordline is to apply common voltage to both of the FETs to compare content of the CAM cell against the states of the bitlines, the common voltage lies within a voltage range defined by $\{V_{th1}, V_{ml-min}+V_{th2}\}$, where $V_{ml-min}$ is the minimum voltage to which the matchline is allowed to discharge during comparison against the states of the bitlines, where $V_{th1}$ is the threshold voltage that turns on FETs which couple the matchline to a low voltage bitline, and where $V_{th2}$ is the threshold voltage which turns on FETs which couple the matchline to a high voltage bitline.

21. The CAM device of claim 15, where the memory cells coupled to the matchline define an instance of a single row, where the CAM device further comprises multiple instances of the single row, each instance comprising a dedicated wordline and a dedicated matchline, where the bitlines are shared by the instances such that each resistance switching memory element couples the respective bitline to a respective matchline, and where the CAM device is to at-once compare a search word against each one of the multiple instances to detect occurrence of one or more matches based on state of the respective matchlines.

22. The CAM device of claim 15, where each resistance switching memory element is a RRAM device.

23. The CAM device of claim 15, further comprising circuitry to determine at least one of (a) a sampling time, (b) a decision threshold, (c) a reference voltage or (d) a reference current associated with the comparing of the bits of the search word against the corresponding bits of data stored in the respective memory cells.

24. The CAM device of claim 23, where the circuitry comprises means for reserving at least one non-addressable row of the CAM device, and means for periodically calibrating at least one of (a) a sampling time, (b) a decision threshold, (c) a reference voltage or (d) a reference current using the at least one non-addressable row.

25. A content-addressable memory apparatus, comprising:
a resistance switching memory element having a high resistance state and a low resistance state;
a first field effect transistor (FET) to gate current through the first resistance switching memory element;
a wordline to control gating by the first FET;
a second resistance switching memory element having a high resistance state and a low resistance state;
a second field effect transistor (FET) to gate current flow through the second resistance switching memory element;
logic to control the wordline to selectively enable the first FET to selectively allow and inhibit current flow through the first resistance switching memory element and so as to selectively enable the second FET to selectively allow and inhibit current flow through the second resistance switching memory element; and
logic to compare state of the compare state of the first and second resistance switching memory elements with a state of the search word bit.

26. The content addressable memory apparatus of claim 25, where:
the content addressable memory apparatus further comprises a matchline, a first bitline and a second bitline;
the first FET and first resistance switching memory element series-couple the matchline with the first bitline; and
the second FET and second resistance switching memory element series-couple the matchline with the second bitline.

27. The content addressable memory apparatus of claim 26, further comprising a circuit to store a bit of data by causing the first resistance switching memory element to have one of the high resistance state and the low resistance state, and by causing the second resistance switching memory element to have the other of the high resistance state and the low resistance state.

28. The content addressable memory apparatus of claim 27, where the logic to compare state of the first and second resistance switching memory elements further comprises:
matchline logic; and
bitline control logic to apply a first voltage to the first bitline and a second voltage to the second bitline dependent on the state of the search word bit;
where the matchline logic is to determine whether the bit of data matches the search word bit dependent upon a voltage decay time of the matchline.

29. The content addressable memory apparatus of claim 25, where the resistance switching memory element is a RRAM element.

30. The content addressable memory apparatus of claim 25, where the high resistance state provides at least one-hundred times the resistance of the low resistance state.

31. The content addressable memory apparatus of claim 25, wherein the content addressable memory apparatus further comprises memory rows, each memory row comprising:
an instance of the wordline;
an instance of the logic to control the wordline; and
memory cells, each memory cell comprising an instance of the first FET, the second FET, the first resistance switching memory element and the second resistance switching memory element.

32. A content addressable memory (CAM) device, comprising:
a matchline;
memory cells coupled to the matchline, each memory cell comprising two resistance switching memory elements, each memory element having two stable states;
bitlines, each resistance switching memory element coupling a respective bitline to the matchline;
means for storing a bit of data in each memory cell in the form of a differential resistance state across the respective two resistance switching memory elements; and means for comparing each bit of a search word against a corresponding bit of data stored in one of the memory cells;

where each memory cell further comprises a switch for each resistance switching memory element, each switch controlled to selectively gate current flow through the associated resistance switching memory element in a manner to inhibit recharge of the matchline.

33. An apparatus, comprising:
a first bistable element and a first transistor in series coupled between a first bitline and a matchline;
a second bistable element and a second transistor in series coupled between a second bitline and the matchline; and
means for providing a gate voltage for the first transistor and a gate voltage of the second transistor to inhibit a charge resupply path to the matchline from a respective bitline at a higher voltage than the matchline.

34. The apparatus of claim 33, where the first bistable element, the second bistable element, and the first and second transistor form an instance of a memory cell, the apparatus further comprising an array of the memory cells.

35. The apparatus of claim 33, where each bistable element includes a resistance switching memory element having two different resistive states.

36. The apparatus of claim 33, where each of the first bistable element and the second bistable element is selectively controlled to change state.

37. The apparatus of claim 33, embodied as a network router.

38. A content addressable memory (CAM) cell, comprising:
a first resistance switching memory element and a second resistance switching memory element, each of the first resistance switching memory element and the second resistance switching memory element coupling a common match-line and a respective bitline; and
a control mechanism to set both of the resistive switching memory elements to a high resistance state to set a data mask, and to set an exclusive one of the first resistance switching memory element and the second-resistive switching memory element to a low state to store a data bit;
where the memory cell further comprises a switch for each resistance switching memory element, each switch controlled to selectively gate current flow through the associated resistance switching memory element in a manner to inhibit recharge of the matchline.

39. The CAM cell of claim 38, where:
the CAM cell further comprises a first FET coupled in series with the first resistance switching memory element between the matchline and the respective bitline, and a second FET coupled in series with the second resistance switching memory between the matchline and the respective bitline;
each FET has a gate coupled to a common wordline; and
the control mechanism is to determine whether the data bit matches a search bit using a wordline voltage that inhibits an FET coupling the matchline and a respective bitline from recharging the matchline.

40. A method of operating a content addressable memory (CAM) cell, the CAM cell comprising a matchline and two bitlines, the CAM cell further comprising a bistable element and a switch in series coupling the matchline and a respective one of the bitlines, each bistable element having a high resistance state and a low resistance state, the method comprising:
storing a data bit in the CAM cell in the form of differing resistance states in the two bistable elements;
setting the matchline to a first voltage;
setting the first respective one of the bitlines to a second voltage, the second voltage one of (a) a voltage substantially less than the first voltage, or (b) a voltage greater than or equal to the first voltage;
setting the second respective one of the bitlines to a third voltage, the third voltage one of (a) a voltage substantially less than the first voltage, or (b) a voltage greater than or equal to the first voltage; and
controlling each switch to inhibit current flow between the matchline and an associated one of the bitlines to recharge the matchline.

* * * * *